(12) United States Patent
Kimura

(10) Patent No.: US 7,312,098 B2
(45) Date of Patent: Dec. 25, 2007

(54) CMOS IMAGE SENSOR AND METHOD OF MANUFACTURING THE SAME

(75) Inventor: Masatoshi Kimura, Tokyo (JP)

(73) Assignee: Renesas Technology Corp., Chiyoda-Ku, Tokyo (JP)

( * ) Notice: Subject to any disclaimer, the term of this patent is extended or adjusted under 35 U.S.C. 154(b) by 597 days.

(21) Appl. No.: 09/970,879

(22) Filed: Oct. 5, 2001

(65) Prior Publication Data
US 2002/0105585 A1 Aug. 8, 2002

(30) Foreign Application Priority Data
Feb. 6, 2001 (JP) ............................. 2001-030137
Apr. 23, 2001 (JP) ............................. 2001-124405

(51) Int. Cl.
*H01L 21/00* (2006.01)
(52) U.S. Cl. ......................................... 438/75; 257/292
(58) Field of Classification Search ........ 257/290–292, 257/431, 443, 461, 463, E27.133; 438/48, 438/241, 199–200, 258, 75, 76, 144
See application file for complete search history.

(56) References Cited

U.S. PATENT DOCUMENTS 6,177,293 B1 * 1/2001 Netzer et al. ................. 438/73
6,329,233 B1 * 12/2001 Pan et al. .................... 438/199
6,333,205 B1 * 12/2001 Rhodes ......................... 438/69
6,506,619 B2 * 1/2003 Chen et al. .................... 438/48

OTHER PUBLICATIONS

Hon-Sum Wong, et al., "CMOS Active Pixel Image Sensors Fabricated Using a 1.8V, 0.25 μm CMOS Technology", IEDM 96, pp. 915-918.

* cited by examiner

*Primary Examiner*—David Vu
(74) *Attorney, Agent, or Firm*—Buchanan Ingersoll & Rooney PC

(57) ABSTRACT

There is provided a CMOS image sensor comprises a LOCOS isolation film 6 formed on the surface of a semiconductor substrate 100 containing a peripheral circuit 31 and a photodiode region 15, a gate electrode 1 formed on the surface of the peripheral circuit 31, a surface-protecting film 8 deposited on at least a portion of the photodiode region 15, and a sidewall 19 of the gate electrode formed without damaging the portion of photodiode region 15 on which a surface-protecting film 8 is deposited, thereby eliminating etching damage on the surface of the substrate to be expected for a photodiode during blanket etch-back, and suppressing fixed pattern noise (FPN).

4 Claims, 19 Drawing Sheets

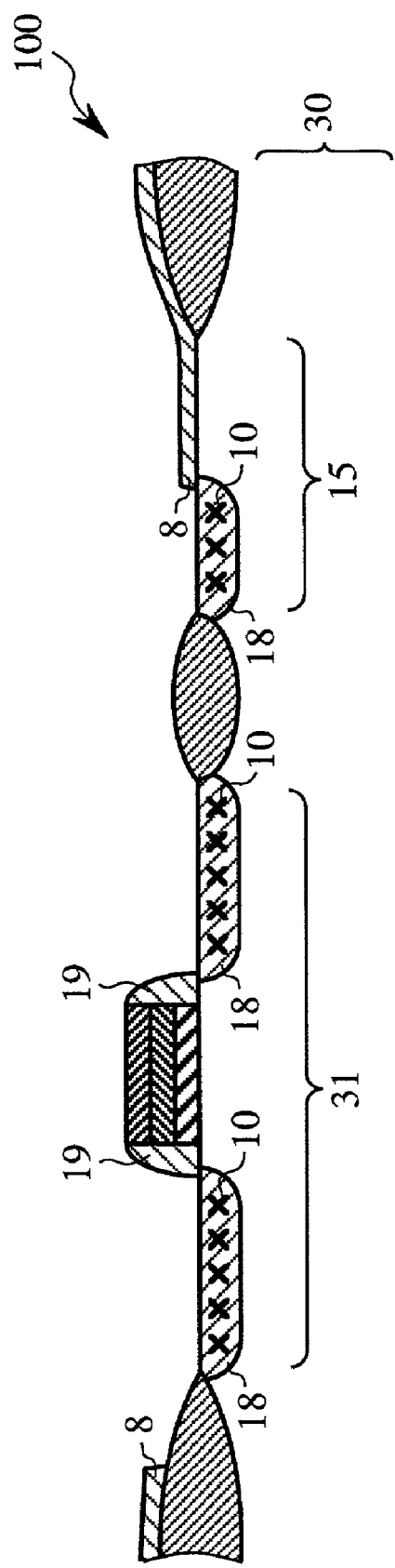

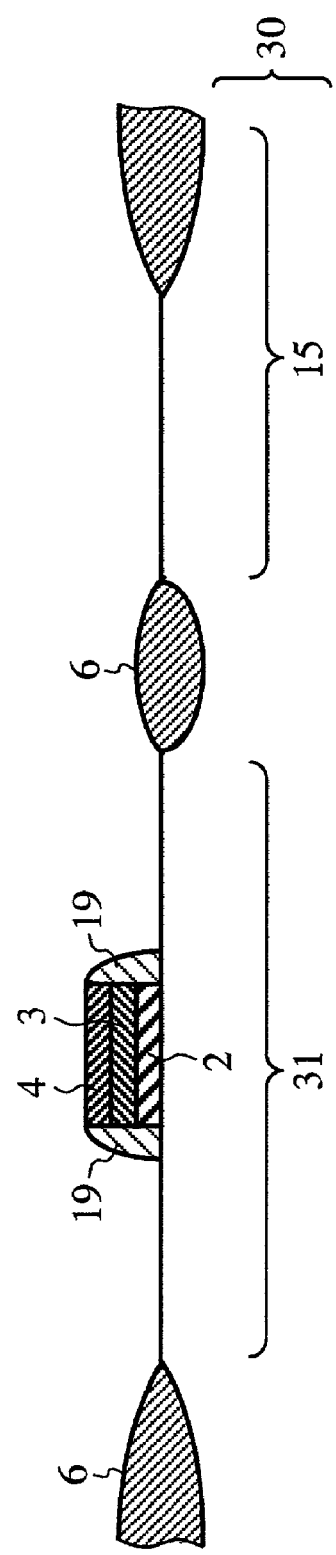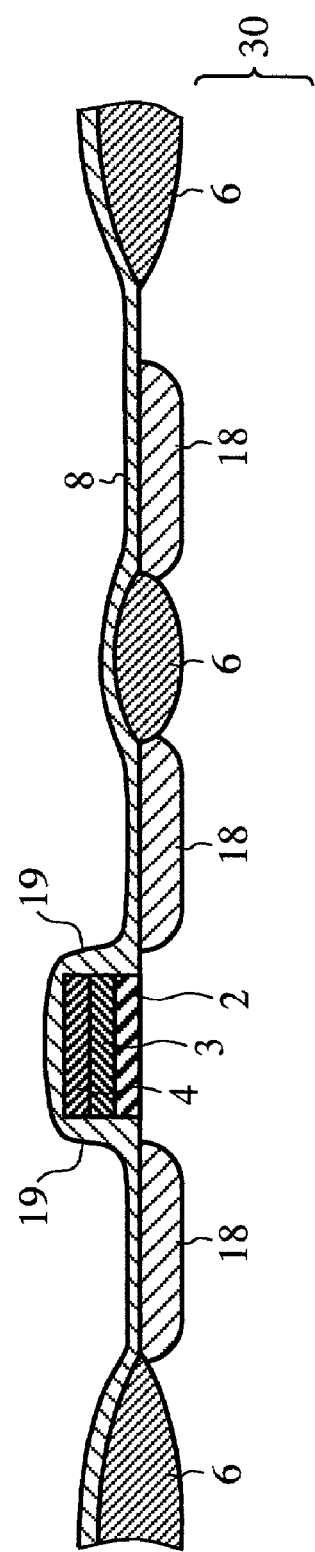

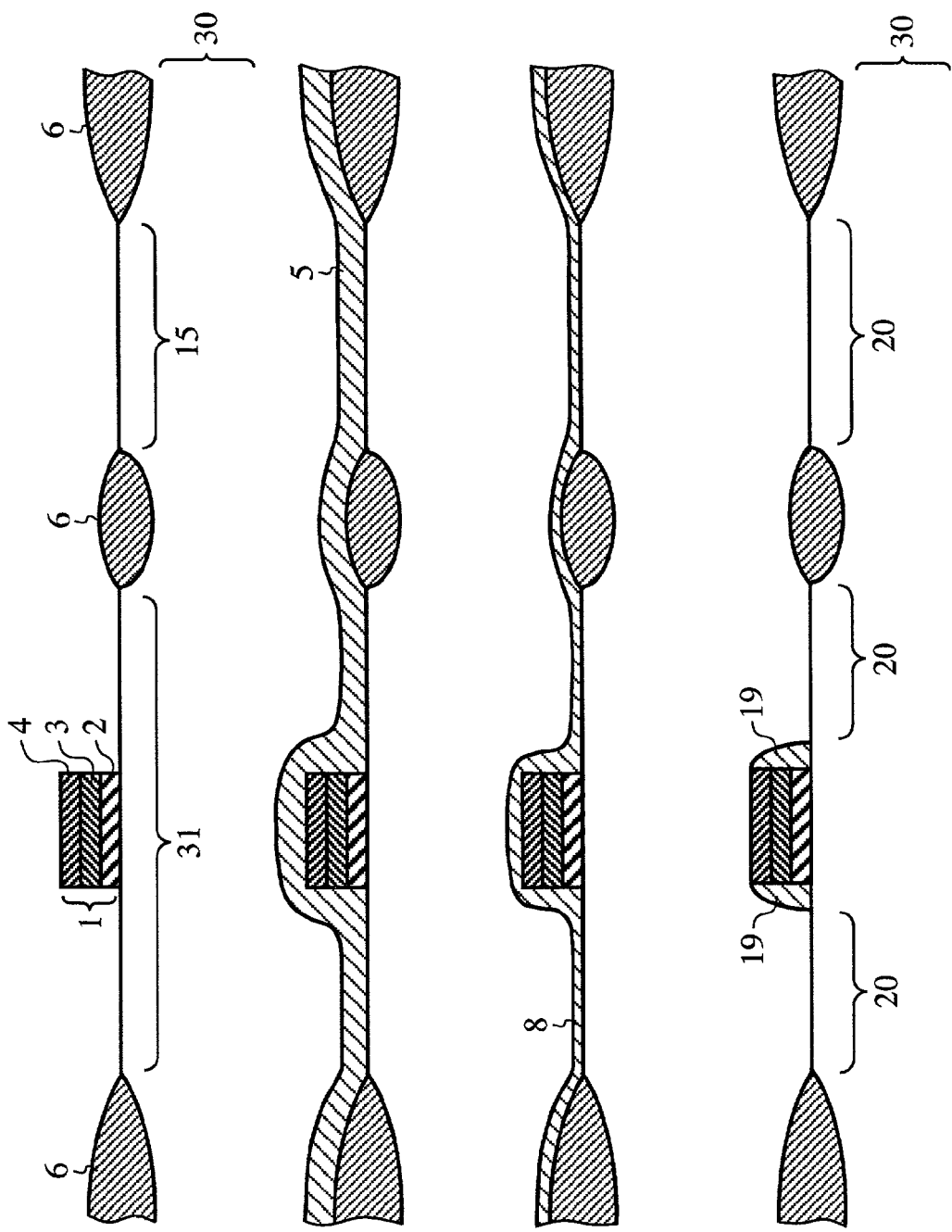

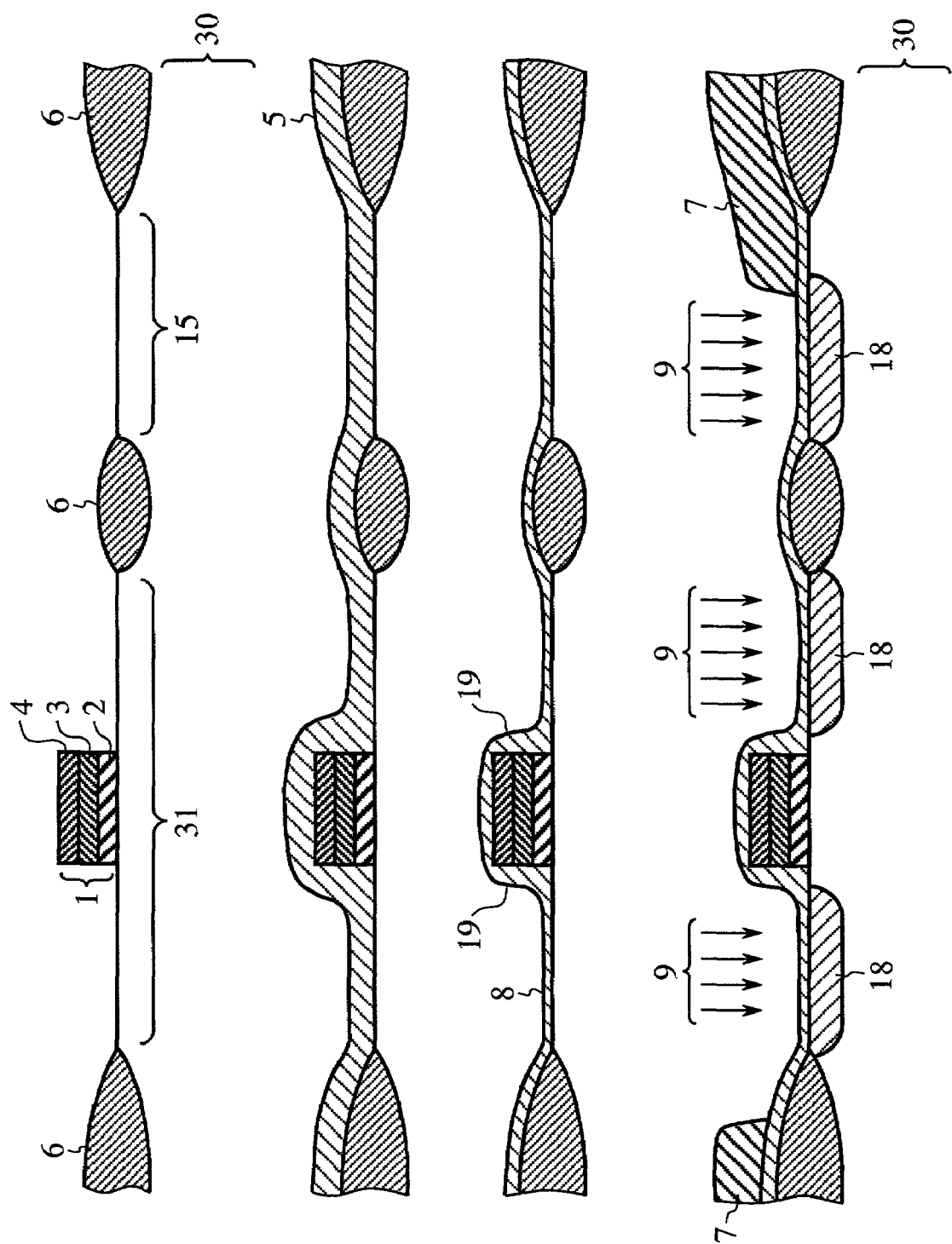

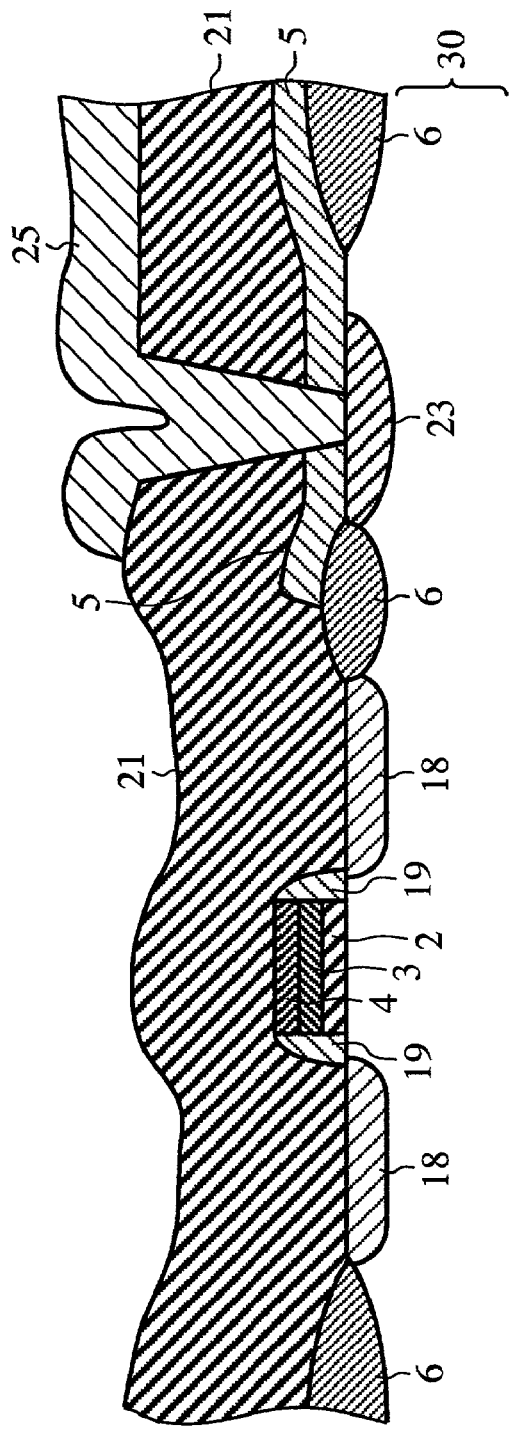
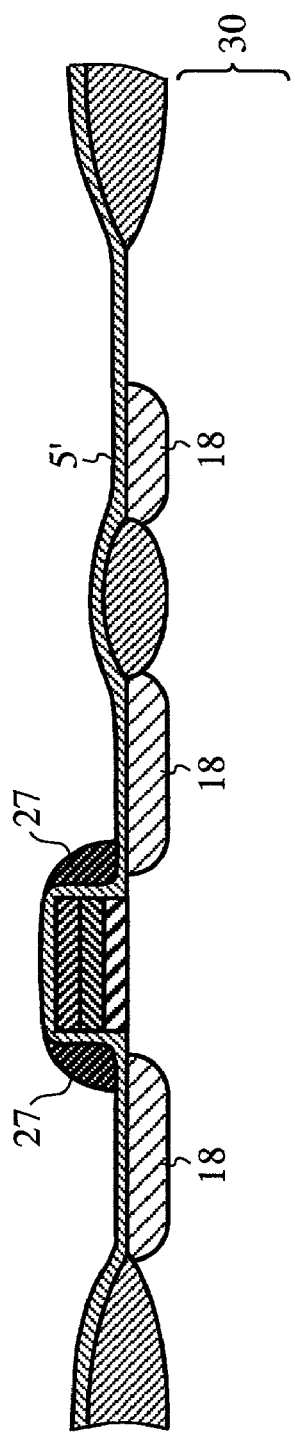

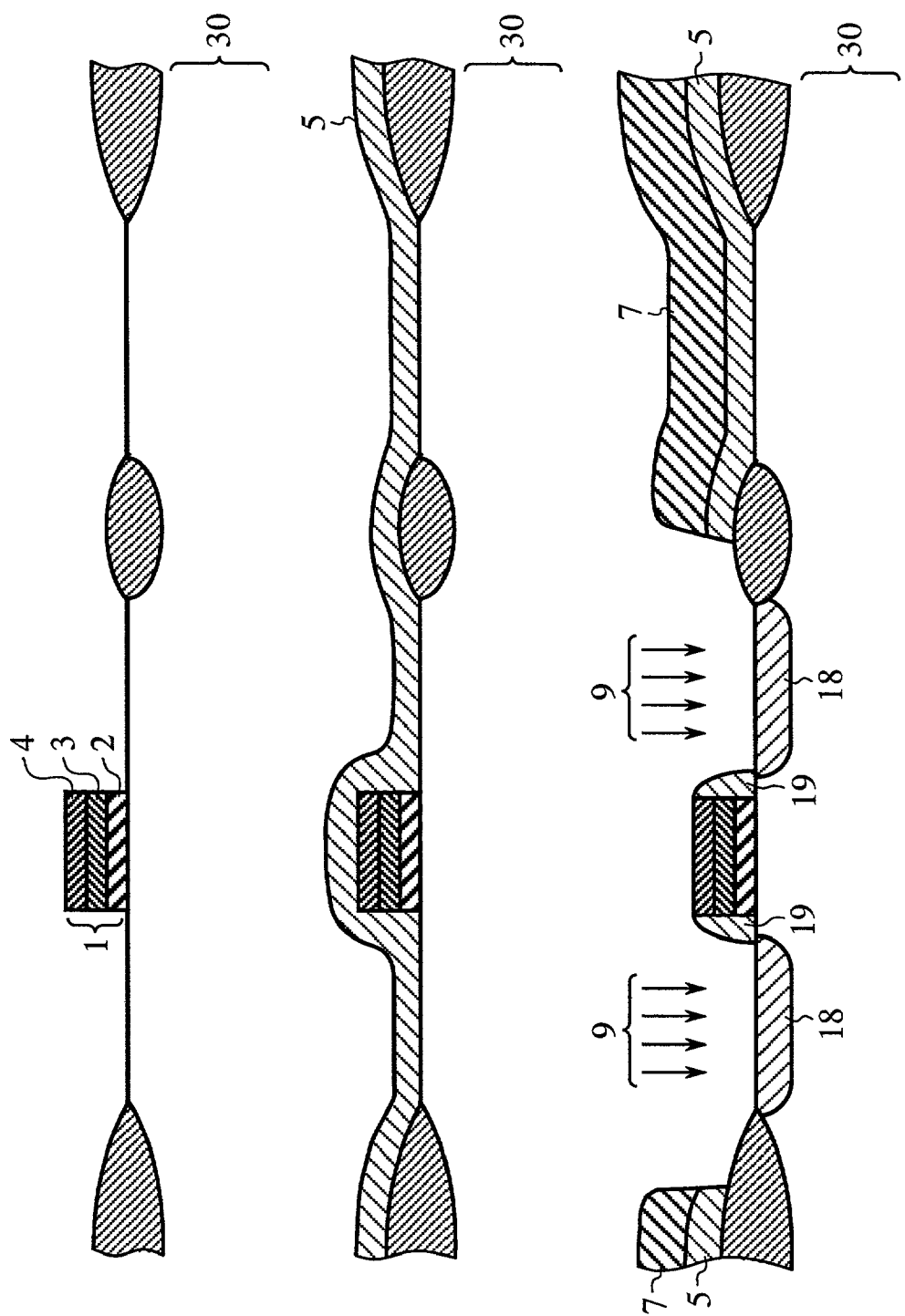

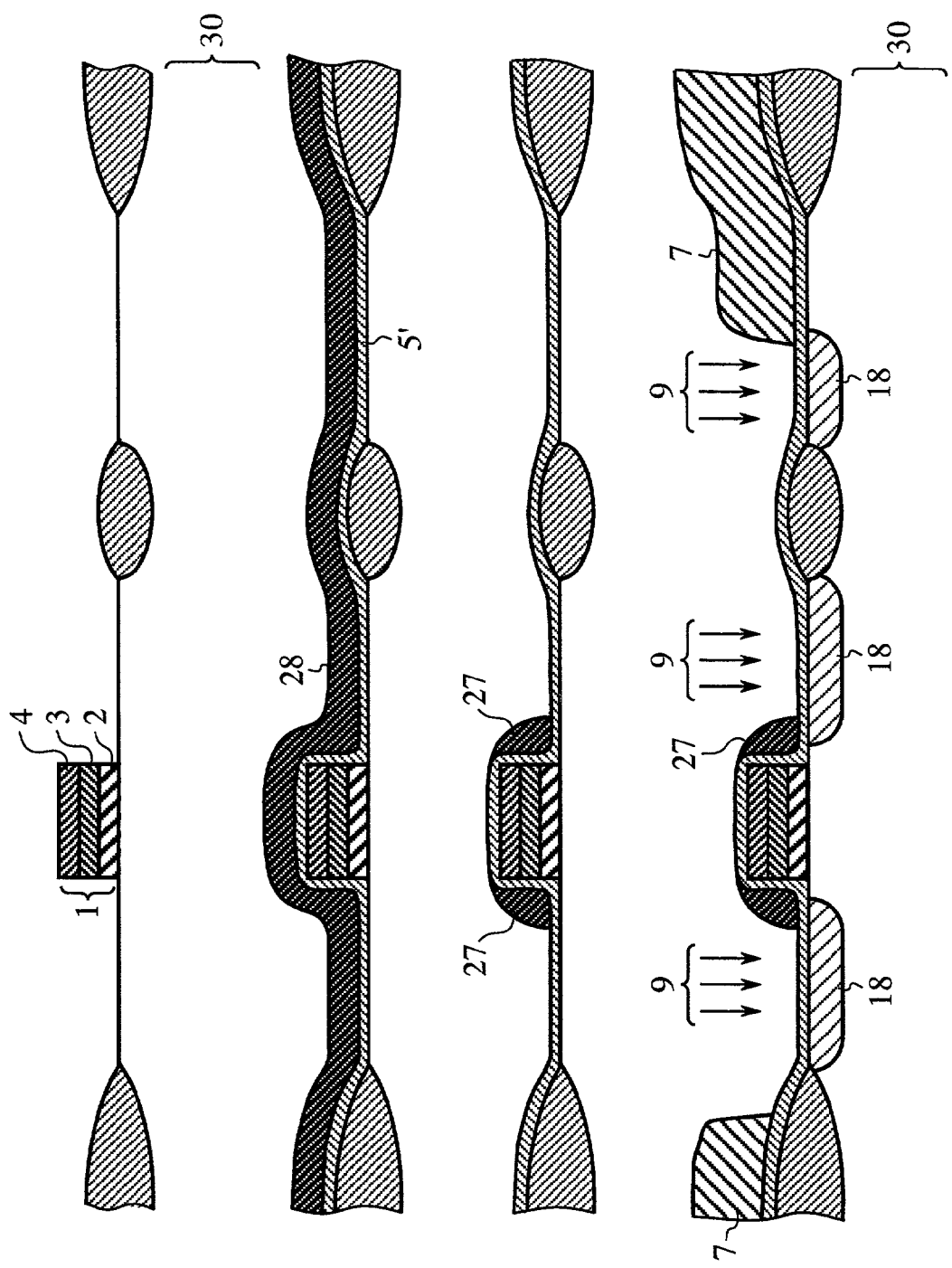

CMOS IMAGE SENSOR AND METHOD OF MANUFACTURING THE SAME

BACKGROUND OF THE INVENTION

1. Field of the Invention

The present invention relates to a CMOS image sensor in which fixed pattern noise in a CMOS image sensor aimed at improving the performance of an imaging semiconductor device can be reduced and a method of manufacturing the same.

2. Description of the Prior Art

FIGS. 23A-23C each are a sectional view showing a conventional CMOS image sensor and the manufacturing method thereof. The figures show a semiconductor substrate 100 such as Si substrate, a gate electrode 1, a gate insulating film 2, a doped polysilicon layer 3, a $WSi_2$ layer 4, a sidewall-forming film (TEOS oxide film) 5, a LOCOS isolation film 6, an etching-damaged layer 10, a photodiode region 15, a sidewall 19, an N well area 30 in the Si substrate, and a peripheral circuit 31.

In a recent system LSI (logic LSI), the on-chip integration in one LSI of a functional module for system-on-chip has become very important, and it can be said that the block of a CMOS image sensor is one of the modules. In order to enable the system-on-chip, it is important to develop the module of the CMOS image sensor based on a conventional logic process.

The method of manufacturing the conventional CMOS image sensor will next be described by referring to FIGS. 23A-23C.

First of all, the LOCOS isolation film 6 is formed on the surface of the semiconductor substrate 100 containing the peripheral circuit 31 and the photodiode region 15, and then the gate electrode 1 is formed on the surface corresponding to the peripheral circuit 31 within the surface of the semiconductor substrate 100 (FIG. 23A).

The gate electrode 1 consists of the three-layered structure formed in the order of the gate insulating film 2, doped polysilicon layer 3, and $WSi_2$ layer 4 on the surface of the semiconductor substrate 100 (herein, on the surface of the N well region 30 formed in the semiconductor substrate 100).

After the state as shown in FIG. 23A, if required, an N-/P-ion implantation for the formation of LDD (Lightly Doped Drain) structure is occasionally done. However, since such an implantation is no direct relationship to a description herein, it will be omitted.

Then, the sidewall-forming film 5 is deposited in a thickness in the order of 1,000-3,000 angstroms all over the surface of the semiconductor substrate 100 (FIG. 23B). As the film to be deposited, a TEOS oxide film is adopted herein. The film thickness thereof is different depending on the generation of the design rule. However, the typical thickness is in the order of 1,000-3,000 angstroms in many cases.

Subsequently, the whole surface of the semiconductor substrate 100 is subjected to etch-back process (referred to as "blanket E/B" hereinafter) without using a mask (FIG. 23C).

Referring to FIG. 23C, a film is formed also in the direction orthogonal to the sidewall on the sidewall portion of a structure rising perpendicularly like a portion of the three-layered structure of the gate electrode 1. Accordingly, the film thickness in the vertical direction of the film formed on the sidewall portion is larger than the thickness in the vertical direction of the film formed on top of the three-layered structure (the upper surface of the $WSi_2$ layer 4).

Therefore, if the amount of over-etching by blanket E/B is properly selected, the film existing in the portion other than the sidewall portion of the three-layer structure is removed, to thereby form the sidewall 19 on the sidewall portion of the three-layered structure as shown in FIG. 23C.

Herein, since there exist variations in the film thickness of the sidewall-forming film 5, the "over etching" is typically performed for a period of time corresponding to 10-40% of "just etching" time in order to eliminate the sidewall-forming film 5 which may be remained as etching residues in all the portions other than the sidewall portion. This over-etching causes plasma damage on the surface of the semiconductor substrate 100 in which a transistor is to be formed except a portion on which the LOCOS isolation film 6 is formed. This plasma damage forms the etching-damaged layer 10 on the surface of the semiconductor substrate 100 containing the surface of the N well area 30. A level which may trap carriers is formed in the etching-damaged layer 10. Moreover, since the LOCOS isolation film 6 is exposed to the plasma for over-etching, the field edge (bird's beak) of the LOCOS isolation film 6 that is the outer edge portion thereof is particularly greatly influenced by the damage caused by the plasma.

Since the conventional CMOS image sensor and the manufacturing method thereof are constructed as mentioned above, there have been the following drawbacks therein. That is, when the etching-damaged layer 10 is formed in the photodiode region, the conversion efficiency of photoelectric conversion by the photodiode reduces; the junction leakage is caused at the field edge (bird's beak) of the LOCOS isolation film 6 that is greatly influenced by the damage caused by the plasma; and FPN (Fixed Pattern Noise) becomes high, to thereby degrade the performance of the sensor.

SUMMARY OF THE INVENTION

The present invention has been accomplished to solve the above-mentioned drawbacks. An object of the invention is to provide a CMOS image sensor in which an occurrence of etching damage during blanket E/B on the surface of a semiconductor substrate in which a photodiode is to be formed is eliminated, and thereby fixed pattern noise (FPN) can be suppressed, and is to provide a method of manufacturing such a sensor.

According to a first aspect of the present invention, there is provided a method of manufacturing a CMOS image sensor comprising the steps of: forming a LOCOS isolation film over the surface of a semiconductor substrate containing a peripheral circuit and a photodiode region; forming a gate electrode on the surface of the peripheral circuit; depositing a sidewall-forming film all over the surface of the semiconductor substrate; and forming the sidewall of the gate electrode without damaging the photodiode region.

Here, the step of forming the sidewall of the gate electrode without damaging the photodiode region may comprise the steps of: performing blanket E/B over the sidewall-forming film thereby forming a surface-protecting film; applying a photoresist over the surface-protecting film while lithographically processing the photoresist thereby patterning the photoresist such that the photoresist exposes the peripheral circuit and covers at least a portion of the photodiode region; and E/B-processing the surface-protecting film thereby forming the sidewall of the gate electrode.

The step of forming the sidewall of the gate electrode without damaging the photodiode region may comprise the steps of: performing blanket E/B over the sidewall-forming film thereby forming the surface-protecting film; and wet-etching the surface-protecting film thereby forming the sidewall of the gate electrode.

The step of forming the sidewall of the gate electrode without damaging the photodiode region may comprise the step of performing blanket E/B over the sidewall-forming film thereby forming a surface-protecting film containing the sidewall of the gate electrode.

The photoresist may be patterned such that the photoresist covers the LOCOS isolation film surrounding the photodiode region of the LOCOS isolation film.

The step of forming the sidewall of the gate electrode without damaging the photodiode region may comprise the steps of: applying a first photoresist over the sidewall-forming film while lithographically processing the photoresist thereby patterning the first photoresist such that the first photoresist exposes the peripheral circuit and covers the photodiode region; E/B-processing the sidewall-forming film thereby forming the sidewall of the gate electrode; performing $P^+$ S/D implantation in the state in which the first photoresist is remaining thereby forming a $P^+$ S/D implanted layer; depositing a first interlayer dielectric such that the insulation film covers the peripheral circuit and the photodiode region while performing a lithographical/etching step thereby forming a contact hole corresponding to the peripheral circuit and the photodiode region; applying a second photoresist such that the photoresist covers the peripheral circuit and the photodiode region while lithographically processing the photoresist thereby patterning the second photoresist such that the second photoresist exposes the contact hole corresponding to the photodiode region in the contact holes; and impurity-implanting through the contact hole corresponding to the photodiode region thereby forming an impurity-diffused layer within the photodiode region.

The step of forming the sidewall of the gate electrode without damaging the photodiode region may comprise the steps of: applying a first photoresist over the sidewall-forming film while lithographically processing the photoresist thereby patterning the first photoresist such that the first photoresist exposes the peripheral circuit and covers the photodiode region; E/B-processing the sidewall-forming film thereby forming the sidewall of the gate electrode; performing $P^+$ S/D implantation in the state in which the photoresist is remaining thereby forming a $P^+$ S/D implanted layer; depositing a first interlayer dielectric such that the interlayer dielectric covers the peripheral circuit and the photodiode region while performing a lithographical/etching step thereby forming the contact hole corresponding to the photodiode region; impurity-implanting through the contact hole thereby forming the impurity-diffused layer in the photodiode region; burying doped polysilicon or doped α silicon in the contact hole while patterning the polysilicon or the silicon; and depositing a second interlayer dielectric such that the insulation film covers the peripheral circuit and the photodiode region while performing a lithographical/etching step thereby forming the contact hole corresponding to the peripheral circuit.

The step of forming the sidewall of the gate electrode without damaging the photodiode region may comprise the steps of: depositing a $Si_3N_4$ film on the sidewall-forming film; and performing blanket E/B over the $Si_3N_4$ film such that the etching is made to stop on the sidewall-forming film while removing only the $Si_3N_4$ film thereby forming the sidewall of the gate electrode.

The method may further comprise the step of performing $P^+$ S/D implantation in the state in which the photoresist is remaining thereby forming a $P^+$ S/D implanted layer.

The method may further comprise the steps of: applying a photoresist over the surface of a semiconductor substrate while lithographically processing the photoresist thereby patterning the photoresist such that the photoresist exposes the peripheral circuit and covers at least a portion of the photodiode region; and performing $P^+$ S/D implantation thereby forming a $P^+$ S/D implanted layer.

The method may further comprise the steps of: applying a photoresist over the surface-protecting film while lithographically processing the photoresist thereby patterning the photoresist such that the photoresist exposes the peripheral circuit and covers at least a portion of the photodiode region; and performing $P^+$ S/D implantation thereby forming a $P^+$ S/D implanted layer in the state in which the surface-protecting film is remaining.

The method further comprise the steps of: applying a photoresist over the sidewall-forming film while lithographically processing the photoresist thereby patterning the photoresist such that the photoresist exposes the peripheral circuit and covers at least a portion of the photodiode region; and performing $P^+$ S/D implantation in the state in which the sidewall-forming film is remaining thereby forming a $P^+$ S/D implanted layer.

The step of forming the sidewall of the gate electrode without damaging the photodiode region further may comprise the step of performing blanket E/B over the sidewall-forming film before the step of patterning the first photoresist thereby forming the surface-protecting film.

According to a second aspect, there is provided a CMOS image sensor comprising: a semiconductor substrate; a LOCOS isolation film formed on the surface of the semiconductor substrate; a peripheral circuit contained in the semiconductor substrate; a photodiode region in the semiconductor substrate; a gate electrode formed on the surface of the peripheral circuit; and a sidewall of the gate electrode formed without damaging at least a portion of the photodiode region.

Here, the image sensor may further comprise a surface-protecting film deposited on at least a portion of the photodiode region, and the sidewall of the gate electrode formed without damaging the portion in which the surface-protecting film is deposited in the photodiode region.

The specific LOCOS isolation film surrounding the photodiode region of the whole LOCOS isolation film may be covered by the surface-protecting film.

The surface-protecting film may be deposited all over the photodiode region.

The image sensor may further comprise: a first interlayer dielectric formed on the surface-protecting film deposited on the surface of the semiconductor substrate and at least a portion of the photodiode region; and a contact hole formed in the first interlayer dielectric.

The image sensor may further comprise: a first interlayer dielectric formed on the surface-protecting film deposited on the surface of the semiconductor substrate and at least a portion of the photodiode region; a contact hole formed in the first interlayer dielectric, corresponding to the photodiode region; and a doped polysilicon wiring buried in the contact hole.

The surface-protecting film may include a TEOS oxide film deposited all over the photodiode region; and a sidewall of the gate electrode may include a TEOS oxide film and a $Si_3N_4$ film.

The gate electrode or gate wiring may be pattern-laid out such that the electrode or the wiring does not cross over the portion of the resist edge taper of a resist mask when performing $N^+/P^+$ source drain implantation.

The resists covering the portion of the photodiode may be pattern-laid out such that the resist exists in independently shaped like an island in each line of picture elements.

BRIEF DESCRIPTION OF THE DRAWINGS

FIG. 1 is a sectional view showing the structure of a CMOS image sensor according to Embodiment 1 of the present invention in a completed state;

FIG. 6 is a sectional view showing the structure in a completed state of wet etching according to Embodiment 3 of the present invention;

FIGS. 7A-7D each are a sectional view showing the structure of a CMOS image sensor according to Embodiment 3 of the present invention in each step of the manufacturing method;

FIG. 8 is a sectional view showing the structure of a CMOS image sensor according to Embodiment 4 of the present invention in a completed state;

FIGS. 9A-9D each are a sectional view showing the structure of the CMOS image sensor according to Embodiment 4 of the present invention in each step of the manufacturing method;

FIG. 13 is a sectional view showing the structure in which the contact hole in the photo diode of a CMOS image sensor according to Embodiment 6 of the present invention is plugged;

FIGS. 14A-14C each are a sectional view showing the structure of the CMOS image sensor according to Embodiment 6 of the present invention in each step of the manufacturing method;

FIG. 16 is a sectional view showing the structure of a CMOS image sensor according to Embodiment 7 of the present invention in a completed state;

FIGS. 17A-17D each are a sectional view showing the structure of the CMOS image sensor according to Embodiment 7 in each step of the manufacturing method;

DETAILED DESCRIPTION OF THE PREFERRED EMBODIMENTS

Figures 2A, 2B, 2C, 2D:
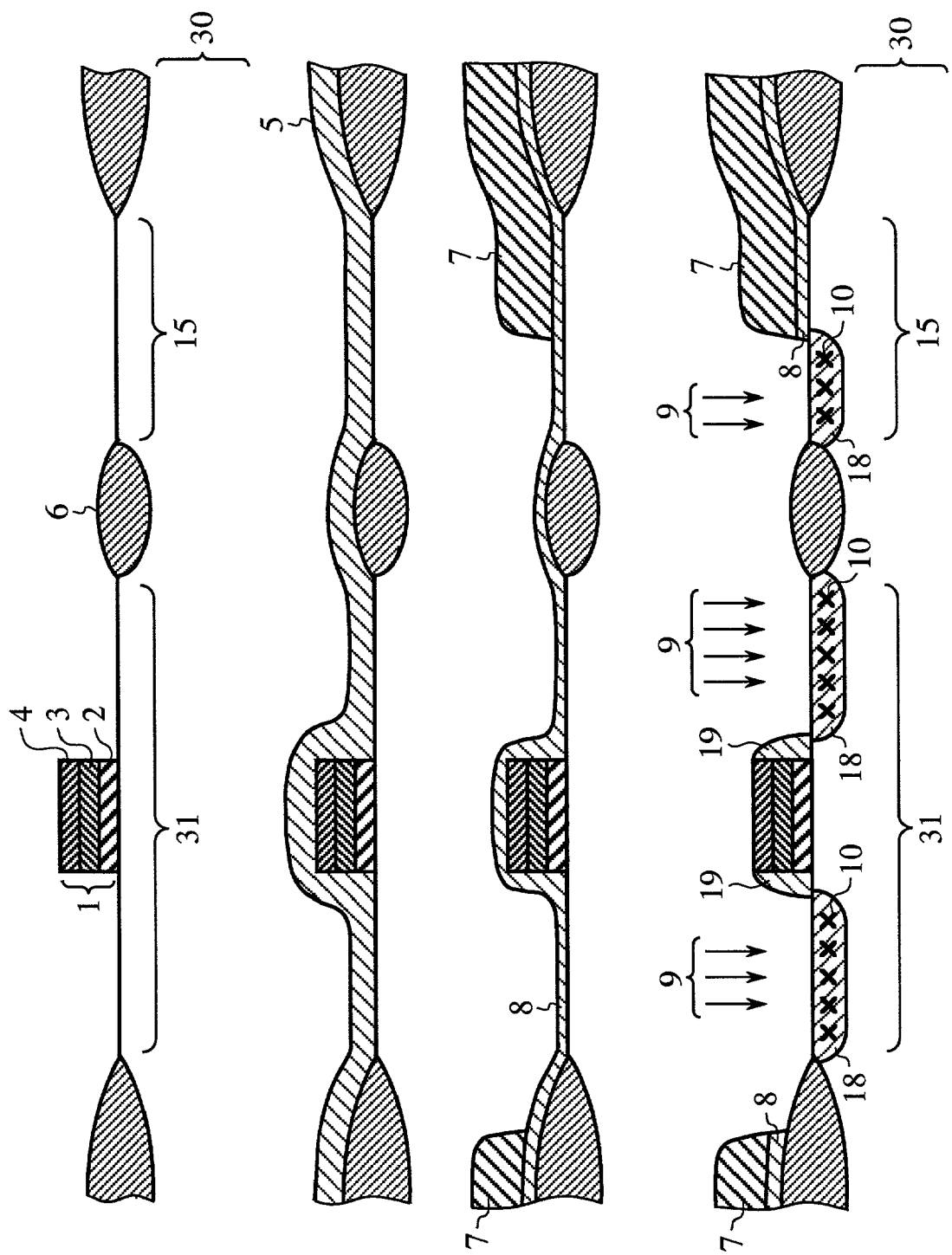
FIGS. 2A-2D each are a sectional view showing the structure of the CMOS image sensor according to Embodiment 1 of the present invention in each step of the manufacturing method.

An embodiment of the present invention will be described below.

Embodiment 1

FIG. 1 is a sectional view showing the structure of the CMOS image sensor according to Embodiment 1 of the present invention in the state of the completion thereof, and FIGS. 2A-2D each are a sectional view showing the manufacturing method (process flow) of the structure thereof. These figures show a semiconductor substrate 100 such as Si substrate, a gate electrode 1, a gate insulating film 2, a doped polysilicon layer 3, a $WSi_2$ layer 4, a sidewall-forming film (TEOS oxide film) 5, a LOCOS isolation film 6, a photoresist 7, a surface-protecting film 8, a $P^+$ S/D implantation (the process of forming a source region and a drain region by implanting a P-type dopant of a high concentration) 9, an etching-damaged layer 10, a photodiode region 15, a sidewall 19, an N well region 30 formed within the Si substrate 100, and a peripheral circuit 31.

Referring to FIG. 1, the CMOS image sensor according to Embodiment 1 has the LOCOS isolation film 6 formed on the surface of the semiconductor substrate 100 containing the peripheral circuit 31 and photodiode region 15, the gate electrode 1 formed on the surface of the peripheral circuit 31, the surface-protecting film 8 deposited on at least a portion of the photo diode region 15, and the sidewall 19 of the gate electrode 1 formed without damaging the portion of the photodiode region 15 in which the surface-protecting film 8 is deposited.

The manufacturing method thereof will next be described.

First of all, the LOCOS isolation film 6 is formed on the surface of the semiconductor substrate 100 containing the peripheral circuit 31 and photodiode region 15, and then the gate electrode 1 is formed on the surface of the semiconductor substrate 100, of the surface thereof, corresponding to peripheral circuit 31 (FIG. 2A).

Then, the sidewall-forming film 5 is deposited in a thickness in the order of 1,000-3,000 angstroms all over the surface of the semiconductor substrate 100 (FIG. 2B). Herein, the TEOS oxide film is used as the sidewall-forming film. However, the type of the film is not limited to the oxide film, and the film thickness is also not particularly limited to this.

Subsequently, the process in which the sidewall 19 of the gate electrode 1 is formed without damaging the photo diode region 15 is carried out.

First of all, blanket E/B is done all over the sidewall-forming film 5, to thereby form the surface-protecting film 8 having a thickness in the order of 200-800 angstroms (FIG. 2C).

After that, the photoresist 7 is applied thereon, and lithographically processed, to thereby patterning the photoresist 7 for either $P^+$ or $N^+$ S/D (FIG. 2C). Shown in FIG. 2C is the example of first patterning the photoresist 7 for $P^+$ S/D. Herein, the "S/D" represents the source region and the drain region.

After patterning the photoresist 7 for $P^+$ S/D, the remaining surface-protecting film 8 is removed by E/B (etchback) processing, to thereby form the sidewall 19 of the gate electrode 1 (FIG. 2D). So far, a process in which the sidewall 19 of the gate electrode 1 is formed without damaging the photo diode region 15 has been completed.

Subsequently, the $P^+$ S/D implantation 9 is done in the photoresist 7 as it stands, to thereby form the $P^+$ S/D implanted layer 18. The $P^+$ S/D implanted layer 18 becomes the source region and drain region of the CMOS transistor. Additionally, since the S/D implantation of $P^+$ has been done herein, the peripheral circuit 31 and photo diode region 15 are formed within the N well region 30 formed in the P type semiconductor substrate 100. When the peripheral circuit 31 and photodiode region 15 are formed directly in the P type semiconductor substrate 100, a S/D implantation of $N^+$ is performed.

As mentioned above, according to Embodiment 1, most of the photodiode region 15 except one portion therein (i.e., a portion where a contact hole will be formed) can be covered by the photoresist 7, thereby reducing the damage level of the etching-damaged layer 10, although in the conventional technology the whole area of the photodiode region 15 is exposed to plasma, resulting in the etching-damaged layer 10.

In addition, according to Embodiment 1, most of the photodiode region 15 except a portion where the contact hole is to be formed can be kept away from the plasma damage by sidewall E/B owing to the surface-protecting film 8 as a protecting oxide film. As a result, FPN (Fixed Patter Noise) can be reduced.

Embodiment 2

Figure 3:
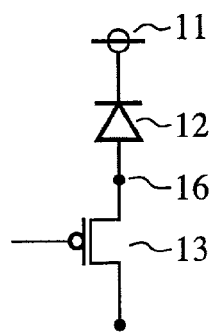
FIG. 3 is a plan view showing the circuit of a typical picture element of a CMOS image sensor according to Embodiment 2 of the present invention.

FIG. 3 is a plan view showing the circuit of the typical picture element of the CMOS image sensor according to Embodiment 2 of the present invention. Referring to FIG. 3, Vdd (power supply) 11 supplies power to the circuit, a photodiode 12 converts light to carriers, a reset transistor 13 resets the initial voltage in the picture element, and a contact hole 16 exists within the photo diode.

Figure 4A:
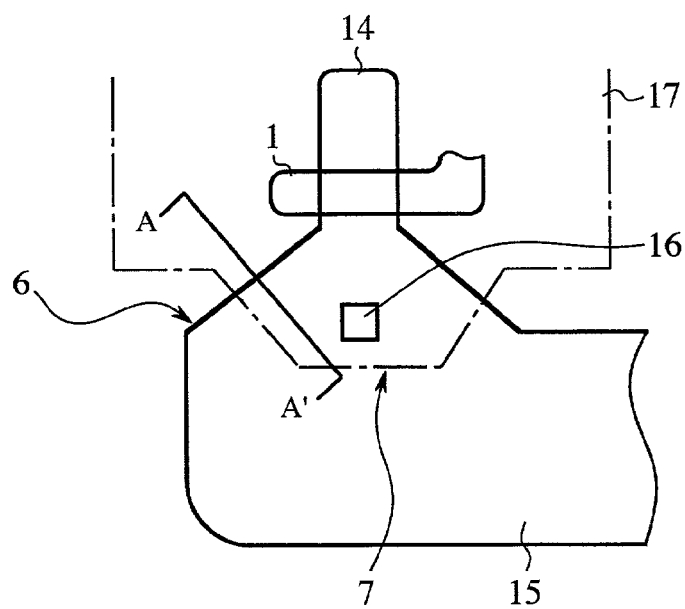
FIG. 4A is a view showing the layout of Embodiment 2, which is the layout in which the circuit shown in FIG. 3 is illustrated.
Figure 4B:
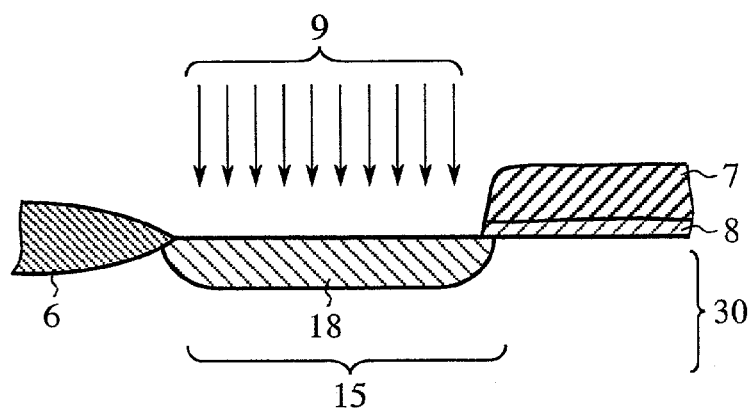
FIG. 4B is a sectional view taken on line A-A' in FIG. 4A.

FIG. 4A is a view showing the layout of Embodiment 2, which is the layout in which the circuit shown in FIG. 3 is illustrated. FIG. 4B is a sectional view taken on line A-A' in FIG. 4A. Shown in FIG. 4A and FIG. 4B are a gate electrode 1, a sidewall-forming film 5, a LOCOS isolation film 6, a photoresist 7, an $N^+/P^+$ S/D implantation 9, an active region 14, a photodiode region 15, a contact hole 16, an $N^+/P^+$ S/D implanted region 17, and an $N^+/P^+$ S/D implanted layer 18.

As shown in FIG. 4A, in order to transfer an electric charge produced within the photodiode region 15 of the picture element to other circuits, the contact hole 16 is necessary in the photodiode region 15. If the $N^+/P^+$ S/D implanted layer 18 having the same conduction type as the one of the impurity layer forming the photodiode region 15 has not been formed in the portion where the contact hole 16 is to be formed, a deterioration in the characteristics of the sensor might be caused by the increase of contact resistance.

For this reason, in Embodiment 1, the mask is open only in the portion where the contact hole 16 is to be formed within the photodiode region 15, the surface-protecting film 8 is removed (etched) from the portion, and a S/D impurity is implanted therein.

However, when the LOCOS isolation film 6 delimiting the photodiode region 15 is extended into the $P^+$ S/D implanted region 17 as shown in the portion along line A-A' of FIG. 4A, the bird's beak portion of the LOCOS separation film 6 receives both the etching damage in the E/B process of the sidewall and the implantation damage in the $N^+/P^+$ S/D implantation 9 as shown in FIG. 4B, to thereby tend to cause the junction leakage, because delimiting the LOCOS isolation film 6 within the $P^+$S/D implanted region 17 is not covered with the photoresist 7.

Figure 5A:
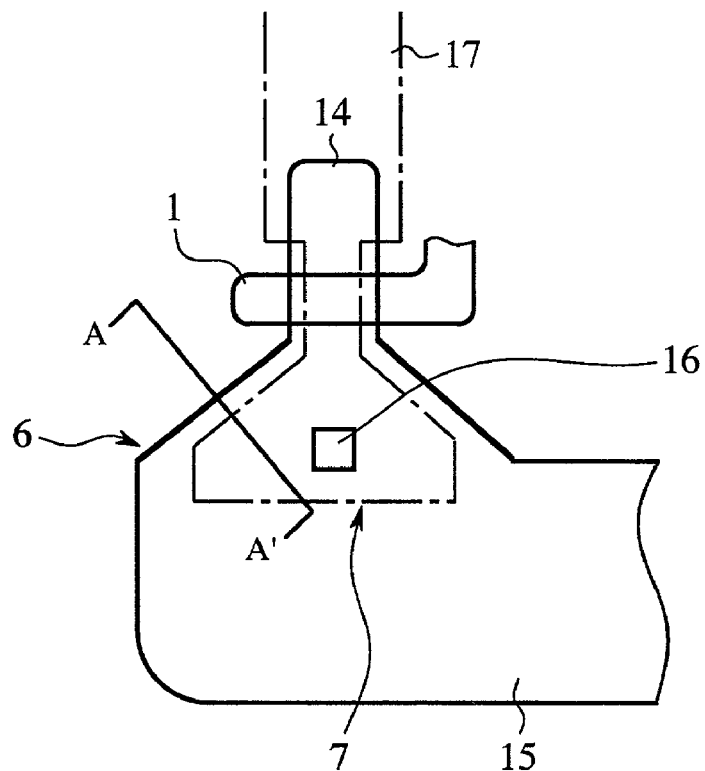
FIG. 5A is a view showing the layout of Embodiment 2, which is the layout in which the circuit shown in FIG. 3 is illustrated.
Figure 5B:
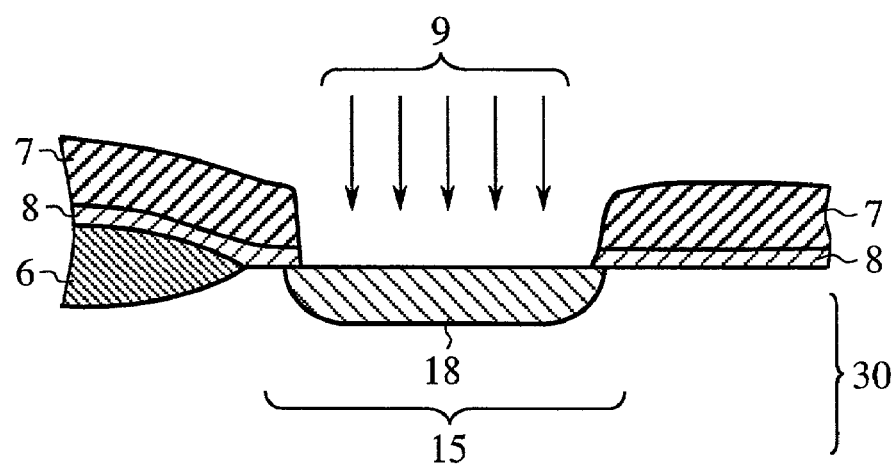
FIG. 5B is a sectional view taken on line A-A' in FIG. 5A.

FIG. 5A is a view showing the layout of Embodiment 2 with respect to the layout of the circuit shown in FIG. 3. FIG. 5B is a sectional view taken on line A-A' in FIG. 5A. The numerals in FIG. 5A and FIG. 5B are the same as those in FIG. 4A and FIG. 4B.

Compared with the layout of Embodiment 2 shown in FIG. 4A and FIG. 4B, as shown in FIG. 5A, since the $P^+$ S/D implanted region 17 is arranged surrounding the contact hole 16 such that the LOCOS isolation film 6 delimiting the photodiode region 15 is not contained in the $P^+$ S/D implanted region 17, the LOCOS isolation film 6 is covered with the photoresist 7 as shown in FIG. 5B, and thereby the edge of the LOCOS isolation film 6 would be avoided from an exposure due to the E/B process of the sidewall and the $N^+/P^+$ S/D implantation 9.

In order to obtain this construction, in Embodiment 2, in the patterning process of the photoresist 7 carried out in Embodiment 1, the photoresist 7 is patterned such that the LOCOS isolation film 6 surrounding the photodiode region 15 is covered by the photoresist.

As shown in FIG. 5B, in the CMOS image sensor according to Embodiment 2, as regards the LOCOS isolation film 6 in the construction of Embodiment 1, the LOCOS isolation film surrounding photo diode region 15 is covered with the surface-protecting film 8.

As mentioned above, according to Embodiment 2, since the edge of LOCOS isolation film 6 within the photodiode (referred to as "LOCOS edge," hereinafter) is not etched by the E/B for forming the sidewall, a junction leakage from the LOCOS edge can be reduced. As a result, FPN (fixed pattern noise) can be reduced.

Embodiment 3

FIG. 6 is a sectional view showing the structure in the state of the completion of wet etching according to Embodiment 3 of the present invention, and FIGS. 7A-7D each are a sectional view showing a manufacturing method of forming a structure according to Embodiment 3. Shown in FIG. 7 is an etching-damage-free surface layer 20, and the other numerals of FIG. 7 are the same as those of FIG. 1 and FIG. 2.

As shown in FIG. 6, the CMOS sensor of Embodiment 3 has a LOCOS isolation film 6 formed on the surface of a semiconductor substrate 100 containing a peripheral circuit 31 and a photodiode region 15, a gate electrode 3 formed on the surface of the peripheral circuit 31, and a sidewall 19 of the gate electrode formed without damaging at least a portion of the photodiode region 15.

The manufacturing method thereof will next be described.

First of all, the LOCOS isolation film 6 is formed on the surface of the semiconductor substrate 100 containing the peripheral circuit 31 and photo diode region 15, and then the gate electrode 1 is formed on the surface of the semiconductor substrate 100 corresponding to the peripheral circuit 31, of the surface thereof (FIG. 7A).

Then, the sidewall-forming film 5 is deposited in a thickness in the order of 1,000-3,000 angstroms all over the surface of the semiconductor substrate 100 (FIG. 7B).

After that, blanket E/B is done all over the sidewall-forming film 5, to thereby form the surface-protecting film 8 having a thickness in the order of 200-800 angstroms (FIG. 7C).

The above-described steps are the same as the step of forming the LOCOS isolation film 6 (FIG. 2A) to the step of forming the surface-protecting film 8 (FIG. 2C) in Embodiment 1.

The later process after FIG. 7C corresponds to an originality in the manufacturing method in Embodiment 3.

After forming the surface-protecting film 8, in Embodiment 3, the surface-protecting film 8 is removed by means of wet etching, to thereby form the sidewall 19 of the gate electrode 1 (FIG. 7D). The etching-damage-free surface layer 20 presents itself in the portion from which surface-protecting film 8 is removed as shown in FIG. 7D.

Since the wet etching is isotropic etching, the shape of the obtained sidewall is slightly changed as compared with E/B anisotropic. However, the change in electric characteristics caused by this shape change in the shape is a level which may be adjusted by conditions of impurity implantation and annealing.

As not shown in the figure, with the structure shown in FIG. 7D, the photoresist 7 is applied over the surface of the semiconductor substrate 100, and lithographically processed as in Embodiment 1, to thereby pattern the photoresist 7 such that the peripheral circuit 31 is exposed and at least a portion of the photodiode region is covered. Then, the $P^+$ S/D implantation 9 is done, to thereby form the $P^+$ S/D implanted layer 18 (FIG. 2D).

In Embodiment 3, the process from the step of forming the surface-protecting film 8 having a thickness in the order of 200-800 angstroms by applying blanket E/B to the sidewall-forming film 5 (FIG. 7C) to the step of forming the sidewall 19 of the gate electrode 1 by removing the surface-protecting film 8 by means of wet etching (FIG. 7D) is the process in which the sidewall 19 of the gate electrode 1 is formed without damaging the photodiode region 15.

In Embodiment 1, the photoresist 7 serving as a mask for $P^+$ S/D is patterned such that the photoresist is opened only in the portion in which the $P^+$ S/D implantation is done. Additionally, using photoresist 7 as the mask, E/B is performed to the portion in which a transistor having the sidewall of PMOS/NMOS is to be formed, and simultaneously E/B is done also to the region to which the $P^+/N^+$ S/D impurity implantation should be carried out. For this reason, the portion of the photodiode in which the photoresist 7 is not opened after patterning is not exposed to the plasma in E/B. However, on the other hand, the region to which the $P^+/N^+$ S/D impurity implantation should be done is inevitably exposed to the plasma during E/B, to thereby suffer the damage therefrom.

That is, in Embodiment 1, the portion where the contact hole is to be formed within the photodiode is exposed to the plasma at the time of E/B when the sidewall film is etched, to thereby cause FNP due to a slight surface damage.

In contrast, according to Embodiment 3, since the remaining film obtained by half-etching of E/B to the sidewall-forming film 5 is removed by means of wet etching, the surface of the semiconductor substrate 100 is not exposed to the plasma of etching at all.

In addition, when E/B is done after applying the mask as in Embodiment 1, dry etching in each step of $P^+/N^+$ S/D is required, rendering an increase of the number of process steps. However, according to Embodiment 3, since wet etching is performed all over the surface, the number of process steps can be reduced.

Embodiment 4

FIG. 8 is a sectional view showing a structure according to Embodiment 4 of the present invention. FIGS. 9A-9D each are a sectional view showing a manufacturing method of forming the structure of Embodiment 4. The numerals of FIG. 8 and FIG. 9 are the same as those of FIG. 1 and FIG. 2.

As shown in FIG. 8, in the CMOS image sensor according to Embodiment 4, a surface-protecting film 8 is deposited all over a photodiode region 15 in addition to the structure of Embodiment 1.

The manufacturing method thereof will next be described.

First of all, a LOCOS isolation film 6 is formed on the surface of a semiconductor substrate 100 containing a peripheral circuit 31 and a photo diode region 15, and then a gate electrode 1 is formed on the surface of the semiconductor substrate 100 corresponding to a peripheral circuit 31 of the surface thereof (FIG. 9A).

Then, a sidewall-forming film 5 is deposited in a thickness in the order of 1,000-3,000 angstroms all over the surface of the semiconductor substrate 100 (FIG. 9B).

Subsequently, blanket E/B is performed all over the sidewall-forming film 5, to thereby form the surface-protecting film 8 containing a sidewall 19 of the gate electrode 1 (FIG. 9C). Herein, the surface-protecting film 8 has a thickness in the order of 200-800 angstroms.

After the surface-protecting film 8 is formed in the processes shown to FIG. 9C, a photoresist 7 is applied over the surface-protecting film 8, and lithographically processed, to thereby pattern the photoresist 7 such that the peripheral circuit 31 is exposed and at least a portion of the photodiode region 15 is covered (FIG. 9D).

Then, a $P^+$ S/D implantation 9 is done in the state where the surface-protecting film 8 remains, to thereby form a $P^+$ S/D implanted layer 18 (FIG. 9D).

In Embodiment 4, the process of forming the surface-protecting film 8 having a thickness in the order of 200-800 angstroms through blanket E/B to the sidewall-forming film 5 (FIG. 9c) is the process in which the sidewall 19 of the gate electrode 1 is formed without damaging the photodiode region 15.

Differing from Embodiments 1 and 3, in Embodiment 4 a $P^+/N^+$ S/D implantation is carried out through the surface-protecting film 8 (oxide film) that remains with a thickness of about 200-800 angstroms. Since the $P^+/N^+$ S/D implantation is done through the surface-protecting film 8, a high-energy for the implantation is necessary.

As mentioned above, according to Embodiment 4, the surface of the photodiode has been covered with the surface-protecting film 8 as in Embodiment 3, rendering no plasma damage to the surface. Additionally, since a high-dose implantation is carried out through the oxide film, an implantation of contaminations such as carbon adhering to the surface caused by knocking-on can be reduced. Moreover, since the P+ S/D implantation 9 is performed in the state where the surface-protecting film 8 remains, a wet-etching process can be eliminated as compared with Embodiment 3.

Embodiment 5

Figure 10:
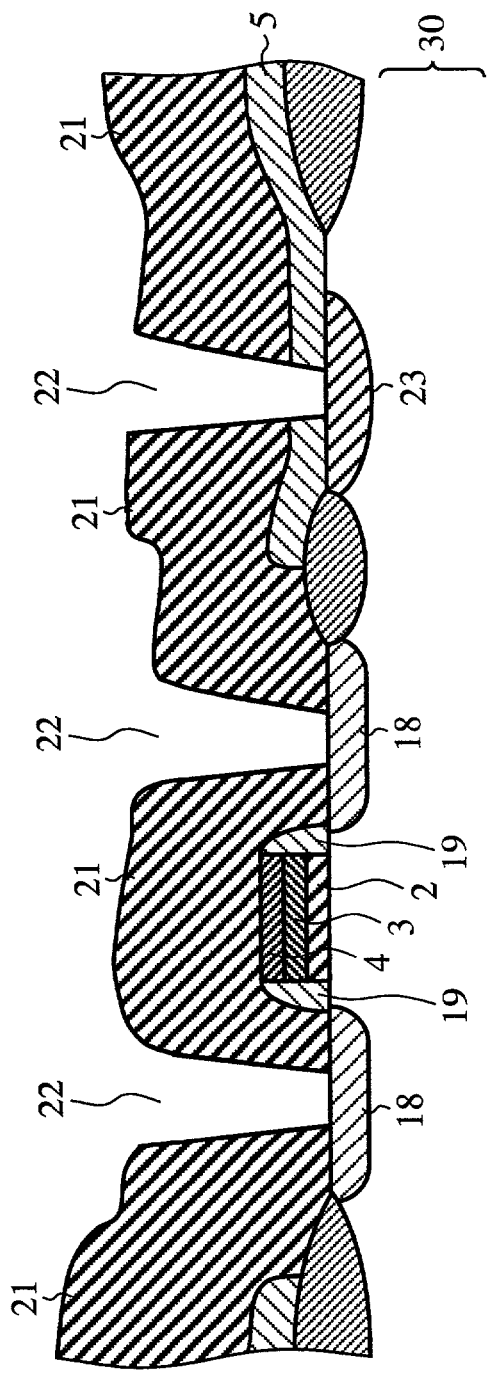
FIG. 10 is a sectional view showing the structure of a CMOS image sensor according to Embodiment 5 of the present invention in a completed state thereof.

FIG. 10 is a view showing a final structure in Embodiment 5 of the present invention. FIGS. 11A and 11B, and FIGS. 12A-12C each are a view showing a manufacturing method of forming a structure of Embodiment 5. These figures show a first interlayer dielectric 21, a contact hole 22, an impurity-diffused layer 23, and an impurity implantation 24. Other numerals are the same as those in FIG. 1 and FIG. 2.

As shown in FIG. 10, in addition to the structure of Embodiment 1, the CMOS image sensor of Embodiment 5 further includes: the first interlayer dielectric 21 formed on a surface-protecting film 8 deposited on the surface of a semiconductor substrate 100 and on at least a portion of a photodiode region 15; and the contact hole 22 formed in the first interlayer dielectric 21.

The manufacturing method will next be described.

Figure 11A:
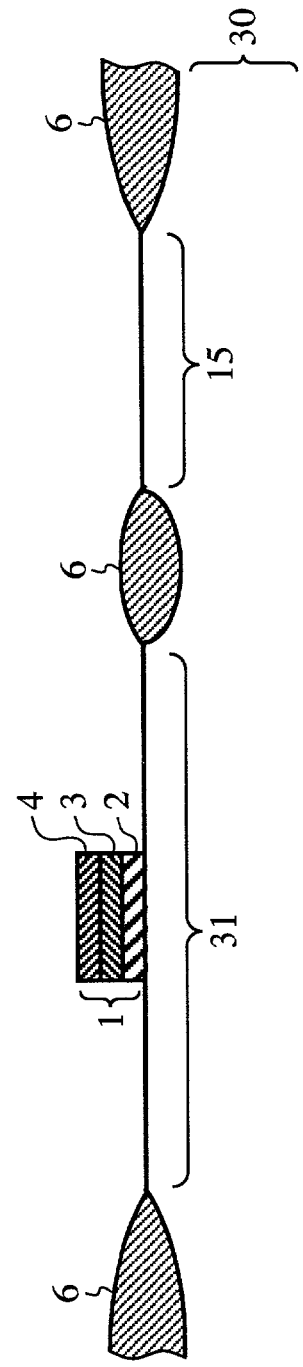
FIGS. 11A and 11B each are a sectional view showing the structure of the CMOS image sensor according to Embodiment 5 of the present invention in each step of the manufacturing method.

First of all, a LOCOS isolation film 6 is formed on the surface of the semiconductor substrate 100 containing a peripheral circuit 31 and a photodiode region 15, and then a gate electrode 1 is formed on the surface of the semiconductor substrate 100 corresponding to the peripheral circuit 31 of the surface thereof (FIG. 11A).

Figure 11B:
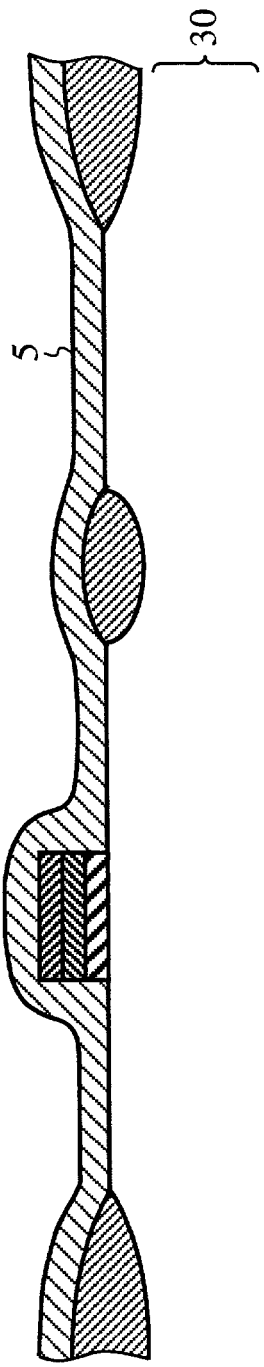

Then, a sidewall-forming film 5 is deposited in a thickness in the order of 1,000-3,000 angstroms all over the surface of the semiconductor substrate 100 (FIG. 11B).

The above-described process is the same as the process from the step of forming the LOCOS isolation film 6 (FIG. 7A) to the step of depositing the sidewall-forming film 5 (FIG. 7B) in Embodiment 3.

In Embodiment 5, it is preferable for reducing a step height to do blanket E/B performed in Embodiment 3 such that the sidewall-forming film 5 remains in a thickness of 200-800 angstroms (FIG. 7C). However, it is not necessarily required.

Accordingly, in the description of Embodiment 5, the case in which this blanket E/B is not carried out will be described hereinafter. Of course, in Embodiment 5 and also Embodiment 6 described later, after performing the blanket E/B process, the process that will be described hereinafter is optionally carried out.

After the sidewall-forming film 5 is deposited all over the surface of the semiconductor substrate 100 (FIG. 11B), the process in which a sidewall 19 of the gate electrode 1 is formed without damaging a photodiode region 15 in Embodiment 5 is performed. Also in Embodiment 6 described below, as in Embodiment 5, the process in which the sidewall 19 of the gate electrode 1 is formed without damaging the photodiode region 15 is performed.

Figures 12A, 12B, 12C:
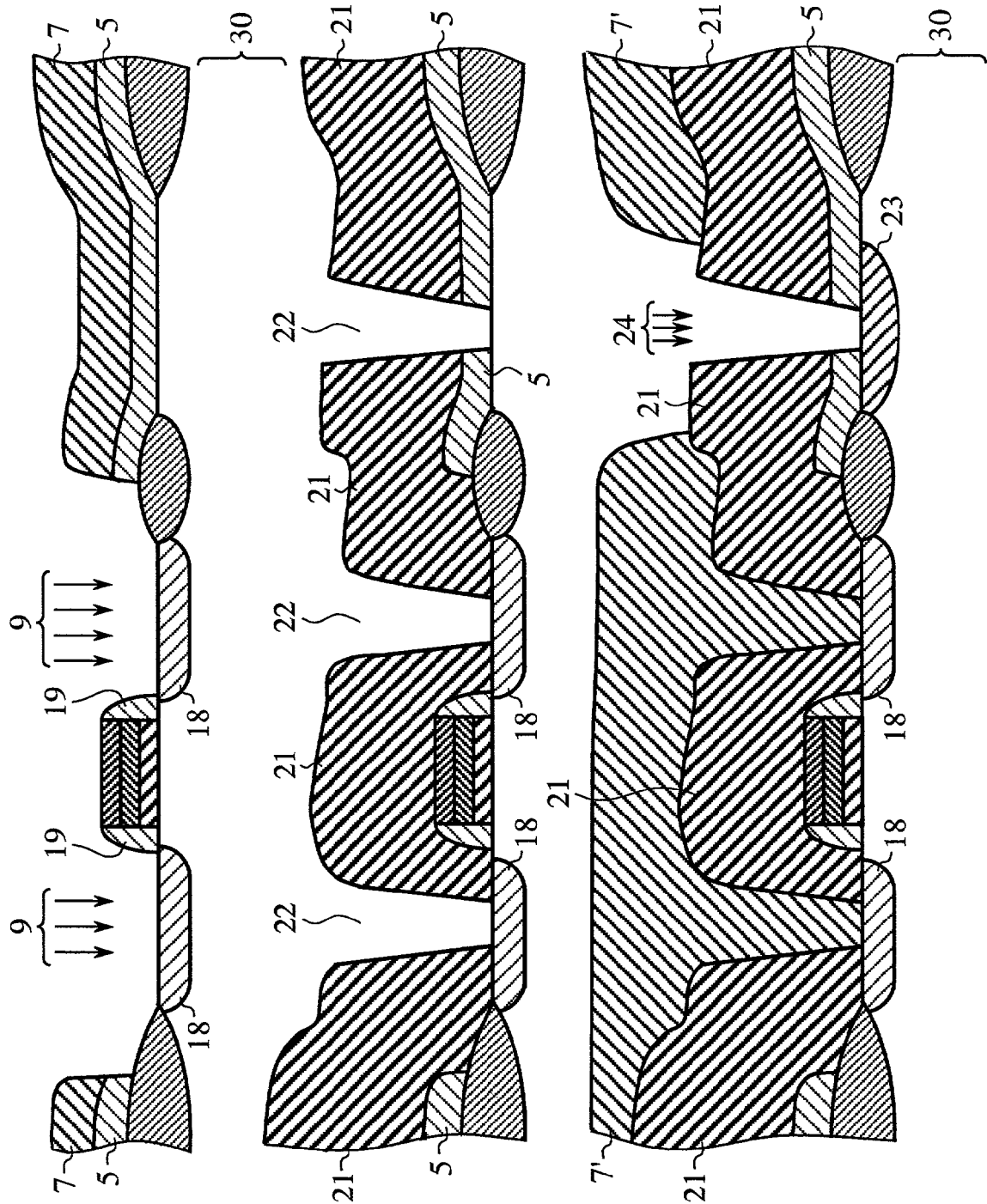
FIGS. 12A-12C each are a sectional view showing the structure of the CMOS image sensor according to Embodiment 5 of the present invention in each step of the manufacturing method.

The process in which the sidewall 19 of the gate electrode 1 is formed without damaging the photodiode region 15 is as follows:

First of all, a photoresist 7 (first photoresist) is coated over the sidewall-forming film 5 deposited all over the surface of the semiconductor substrate 100 (over a surface-protecting film 8 when the process of blanket E/B is done.) and lithographically processed, to thereby pattern the photoresist 7 (FIG. 12A). Herein, the photoresist 7 is patterned such that the photoresist covers the photodiode region 15, and has an opening to the peripheral circuit 31.

Subsequently, E/B is done through the photoresist 7 that is patterned, to thereby remove the sidewall-forming film 5 (TEOS oxide film 5) of the peripheral circuit 31, and form the sidewall 19 and an opening (FIG. 12A). At this time, because no opening has been formed in the portion of the photoresist 7 covering the photodiode region 15, the surface of the semiconductor substrate 100 in the photodiode region 15 does not suffer the damage caused by E/B. The process to this step is the process in which the sidewall 19 of the gate electrode 1 is formed without damaging the photodiode region 15.

Then, a P+ S/D implantation 9 is performed through the opening formed through a TEOS oxide film 5 in the peripheral circuit 31, to thereby form a P+ S/D implanted layer 18 (FIG. 12A). At this time, because no opening is formed in the portion of the photoresist 7 covering the photodiode region 15, the surface of the semiconductor substrate 100 in the photodiode region 15 does not suffer the damage caused by the P+ S/D implantation 9.

In Embodiment 5, the following process follows the process in which the sidewall 19 of the gate electrode 1 is formed.

The P+ S/D implanted layer 18 is formed (FIG. 12A), and the photoresist 7 is removed by ashing, followed by depositing a first interlayer dielectric 21, and lithographical and etching processing for forming contact holes 22 (FIG. 12B).

Then, a photoresist 7' (second photoresist) is applied on the topography, and lithographically processed, to thereby the pattern photoresist 7' (FIG. 12C). Herein, the photoresist 7' is patterned such that the photoresist covers the region of the peripheral circuit 31, and has the opening for forming the photodiode region 15.

Subsequently, an impurity implantation 24 is performed through the opening of the contact hole 22, to thereby form an impurity-diffused layer 23 (FIG. 12C). Upon the impurity implantation 24, the impurity having the same conduction type as the one of the impurity constituting the photodiode region should be implanted. For instance, in the circuit of Embodiment 2 shown in FIG. 5, since the photodiode is connected with the PMOS transistor, a P type impurity should be implanted in the impurity-diffused layer 23 forming the contact of the photodiode.

As mentioned above, in Embodiment 5, as well as Embodiments 3 and 4, the photodiode region 15 does not suffer a surface damage caused by E/B to the sidewall at all.

According to Embodiment 5, as compared with Embodiment 1, since there exists no damage caused by the etchback and by ion implantation to the LOCOS edge, the junction leakage can further be reduced. Moreover, the optimum condition of implantation for only the photodiode contact can be set, which enables to set the optimum condition having a balance between contact resistance and junction leakage as compared with the other contact holes in which a condition of implantation is previously fixed by transistor characteristics.

Embodiment 6

FIG. 13 is a sectional view showing a structure in which a contact hole 26 in a photo diode according to Embodiment 6 of the present invention is buried or plugged. FIGS. 14A-14C and FIG. 15 are views showing a manufacturing method of forming the structure of Embodiment 6. Shown in FIG. 13, FIG. 14, and FIG. 15 are a second interlayer dielectric 21', a doped polysilicon wiring 25, and a contact hole 26 within the photodiode. The other numerals are the same as those in FIGS. 10-12.

As shown in FIG. 13, in addition to the structure of Embodiment 1, a CMOS image sensor of Embodiment 6 comprises: a first interlayer dielectric 21 formed on a surface-protecting film 8 deposited on the surface of a semiconductor substrate 100 and on at least a portion of a photodiode regions 15; a contact hole 26 formed in a first interlayer dielectric 21 corresponding to a photodiode region 15; and a doped polysilicon wiring 25 buried in the contact hole 26.

The manufacturing method thereof will next be described.

The process from the step of forming a LOCOS isolation film 6 on the surface of a semiconductor substrate 100 containing a peripheral circuit 31 and a photodiode region 15 (FIG. 14A) to the step in which P⁺ S/D implantation layer 18 is formed (the step of forming sidewall 19 of gate electrode 1) (FIG. 14C) is the same as the process of Embodiment 5 (from FIG. 11A to FIG. 12A).

Figure 15A:
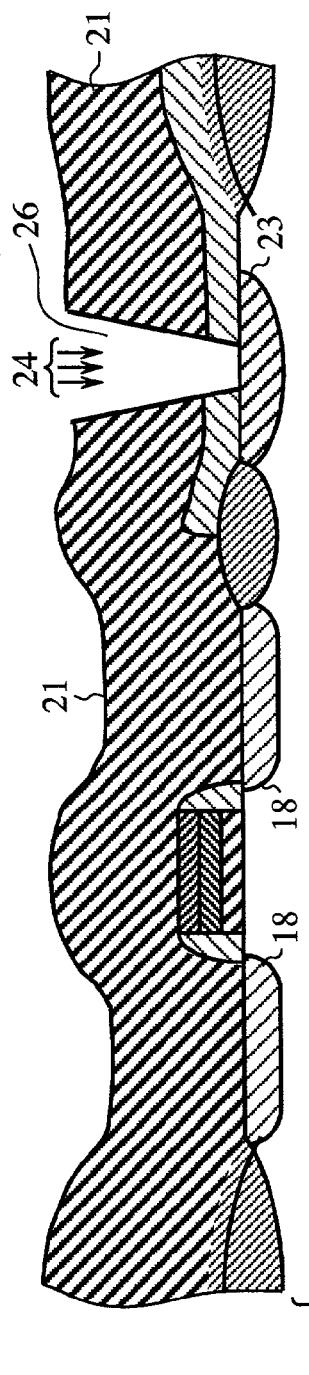
FIGS. 15A-15C each are a sectional view showing the structure of the CMOS image sensor according to Embodiment 6 of the present invention in each step of the manufacturing method.

As shown in FIG. 14C, the P⁺ S/D implanted layer 18 is formed, and a photoresist 7 is removed by ashing, followed by depositing the first interlayer dielectric 21, and lithographical and etching processing for forming the contact holes 26 corresponding to the photodiode region 15 (FIG. 15A).

As shown in FIG. 12B in Embodiment 5, a contact hole 22 corresponding to a peripheral circuit 31 and the contact hole 26 corresponding to the photodiode region are formed. However, as shown in FIG. 15A in this Embodiment 6, only the contact hole 26 corresponding to the photodiode region is formed.

Then, an impurity implantation 24 is performed through the contact hole 26 corresponding to the photodiode region 15, to thereby form an impurity-diffused layer 23 within the photodiode region 15 (FIG. 15A).

Figure 15B:
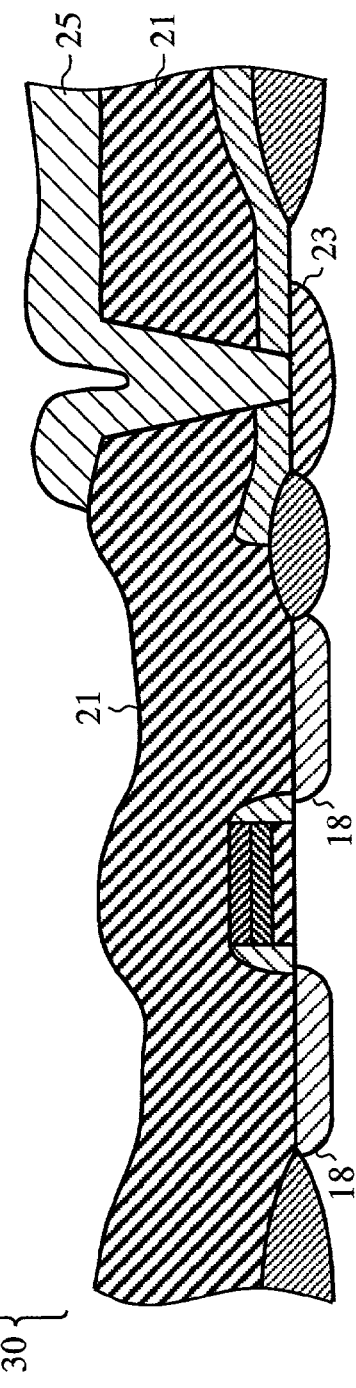

Subsequently, doped polysilicon or doped α silicon 25 is deposited all over the surface, to thereby bury the contact hole 26 within the photodiode, and then is connected to a necessary circuit by patterning processing (FIG. 15B).

Figure 15C:
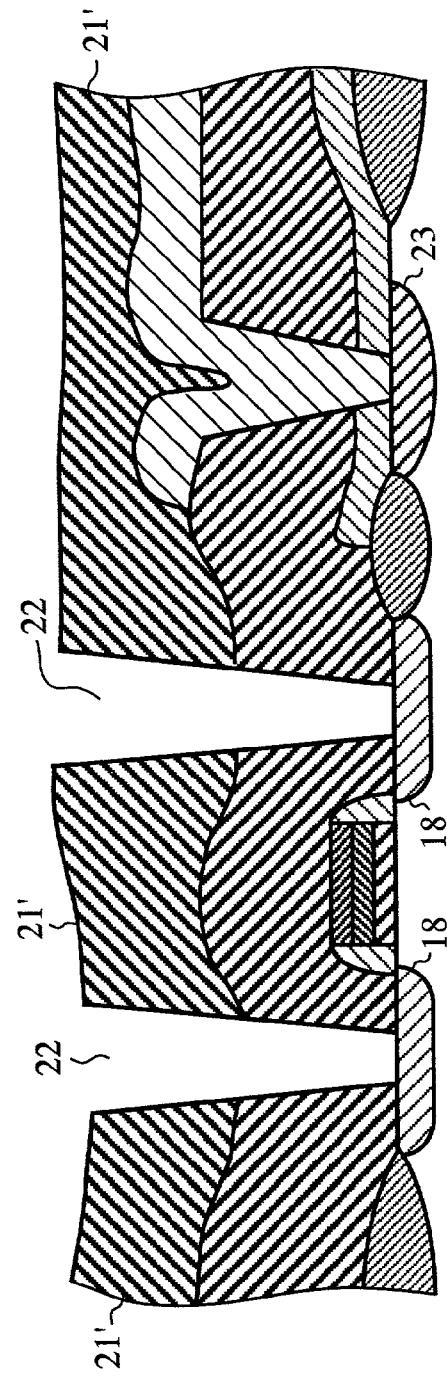

After that, a second interlayer dielectric 21' such as TEOS oxide film is deposited, and then is subjected to lithographical and etching process for forming the contact hole 22 (FIG. 15C).

In Embodiment 5, the contact hole 22 is formed within the photodiode region 15. In order to form Al (aluminum) wirings, Al is buried in the contact hole 22. At this time, Si occasionally precipitates in the interface between the semiconductor substrate 100 made of silicon and the aluminum wiring by undergoing a subsequent annealing process. In a fine pattern, the precipitated Si covers wholly the interface, and results in increasing contact resistance. In order to prevent this, a barrier metal is interposed between the semiconductor substrate 100 and the Al wiring. In addition, in the contact hole 22, upon formation of the barrier metal, the contact resistance is brought to an ohmic property by typically sputtering TiN (titanium nitride), Ti (titanium), and so on, and then forming TiSi₂ (titanium silicide) therefrom in the bottom of the contact hole by means of RTA (Rapid Thermal Annealing) (lamp annealing) and the like. At this time, when contact hole 22 is formed closely to the bird's beak of LOCOS isolation film because of the displacement of lithographical alignment, the failure that formed TiSi₂ pierces through the junction and thereby causes the junction leakage might occur because the junction between N well area and P type impurity-diffused layer 23 is at a shallow depth in the vicinity of the bird's beak.

By contrast, according to Embodiment 6, because contact hole 26 requiring no barrier metal with doped polysilicon or doped α silicon 25 being buried therein, is formed within photodiode region 15, the effect that the junction leakage hardly occurs even if an alignment error in the lithography is caused is obtained.

Embodiment 7

FIG. 16 is a view showing the final structure according to Embodiment 7 of the present invention, and FIGS. 17A-17D each are a view showing the manufacturing method of forming the structure of Embodiment 7. Shown in FIG. 16 and FIGS. 17A-17D are a Si₃N₄ (silicon nitride) sidewall 27, and a Si₃N₄ film 28. The other numerals are the same as those in FIGS. 10-12C.

As shown in FIG. 16 in the CMOS image sensor of Embodiment 7, surface-protecting film 8 in the structure of Embodiment 1 consists of TEOS oxide film 5' formed all over photodiode region 15, and the sidewall 27 of the gate electrode in the structure thereof consists of a TEOS oxide film 5' and the Si₃N₄ film 28.

The manufacturing method thereof will next be described.

First of all, a LOCOS isolation film 6 is formed on the surface of a semiconductor substrate 100 containing a peripheral circuit 31 and a photo diode region 15, and then a gate electrode 1 is formed on the surface of the semiconductor substrate 100 corresponding to the peripheral circuit 31 of the surface thereof (FIG. 17A).

Then, TEOS oxide film 5' having a thickness in the order of 200 to 800 angstroms that is desired to previously be left over the photodiode is deposited all over the surface of the semiconductor substrate 100 (FIG. 17B). Herein, the TEOS oxide film 5' is the same as the sidewall-forming film 5 in Embodiments 1-6. However, in Embodiment 7, as described hereinafter, because the sidewall 27 of the gate electrode 1 consists of the TEOS oxide film 5' and Si₃N₄ film 28, the TEOS oxide film will be referred to as the TEOS oxide 5'.

Then, according to Embodiment 7, the process in which the sidewall 27 is formed around the gate electrode 1 without damaging the photodiode region 15 is performed. The process in which the sidewall 27 is formed around gate electrode 1 without damaging photodiode region 15 is as follows:

The Si₃N₄ film 28 having a thickness in the order of 500 to 2,000 angstroms is deposited on the TEOS oxide film 5' (FIG. 17B).

After that, the sidewall 27 of the gate electrode is formed by performing blanket E/B over the Si₃N₄ film 28 and removing only the Si₃N₄ film 28 such that the etching is made to stop on the TEOS oxide film 5' (FIG. 17). Herein, it should be noted that only the Si₃N₄ film 28 is subjected to E/B, and the etching is made to stop on the TEOS oxide film 5'. For this reason, for instance, an etching gas will be applied, having a higher etching selectivity for the Si₃N₄ film 28 such that an etching rate for the Si₃N₄ film 28 is higher than that for the TEOS oxide film 5'. In this case, it is preferable that the etching selectivity ratio of the Si₃N₄ film 28 to the TEOS oxide film 5' is high. The process to this step is the process in which sidewall 27 is formed around the gate electrode 1 in Embodiment 7.

Then, photoresist 7 is applied over TEOS oxide film 5', and subjected to lithographical processing, to thereby pattern photoresist 7 such that peripheral circuit 31 and the photodiode region are exposed (FIG. 17D).

After that, P⁺ S/D implantation 9 is done in the state in which TEOS oxide film 51 is remaining, to thereby form P⁺

S/D implanted layer 18 (FIG. 17D). At that time, optionally, remaining TEOS oxide film 5' is subjected to E/B by use of each mask.

In the halfway-stopping etching performed in Embodiment 1 etc. (the etching in which surface-protecting film 8 having a thickness in the order of 200 angstroms to 800 angstroms is made to remain), the oxide film on the photodiode can not possibly remain because of the accuracy trouble of the etching machine (the variation in the etching rate) and the variation in the thickness of the deposited film.

In contrast, according to Embodiment 7, because the etching of the $Si_3N_4$ film is not made to halfway stop by controlling the etching time, but the etching that stops the progress thereof by itself on the underlying oxide film is adopted, the effect that the stability of the process is extremely high is obtained.

In addition, when the $Si_3N_4$ film exists in a portion of the sidewall and additionally the alignment error of the lithography for forming the contact occurs, the sidewall on the side of the gate electrode is partially removed. For this reason, when the impurity implantation is done in order to reduce the contact resistance, the impurity is implanted into the vicinity of the gate electrode, which results in the S/D withstand voltage deterioration and the deterioration of the hot carrier resistance of the transistor.

In Embodiment 7, because the $Si_3N_4$ film is not etched even if the opening of the contact hole borders on the sidewall, the effect that the variation in the performance of the transistor does not occur is obtained.

In the above-mentioned description, the case in which the $P^+$ S/D implantation is carried out to the N type peripheral circuit 31 and photodiode region 15 formed within the N well region 30 formed in the P type semiconductor substrate 100, and thereby the $P^+$ S/D implanted layer 18 is formed, is described. However, the $N^+$ S/D implantation is done to the P type peripheral circuit 31 and photodiode region 15 formed in the P type semiconductor substrate 100, and the $N^+$ S/D implanted layer 18 is formed. Needless to say, the present invention is applied also to the latter case.

Embodiment 8

Figure 18:
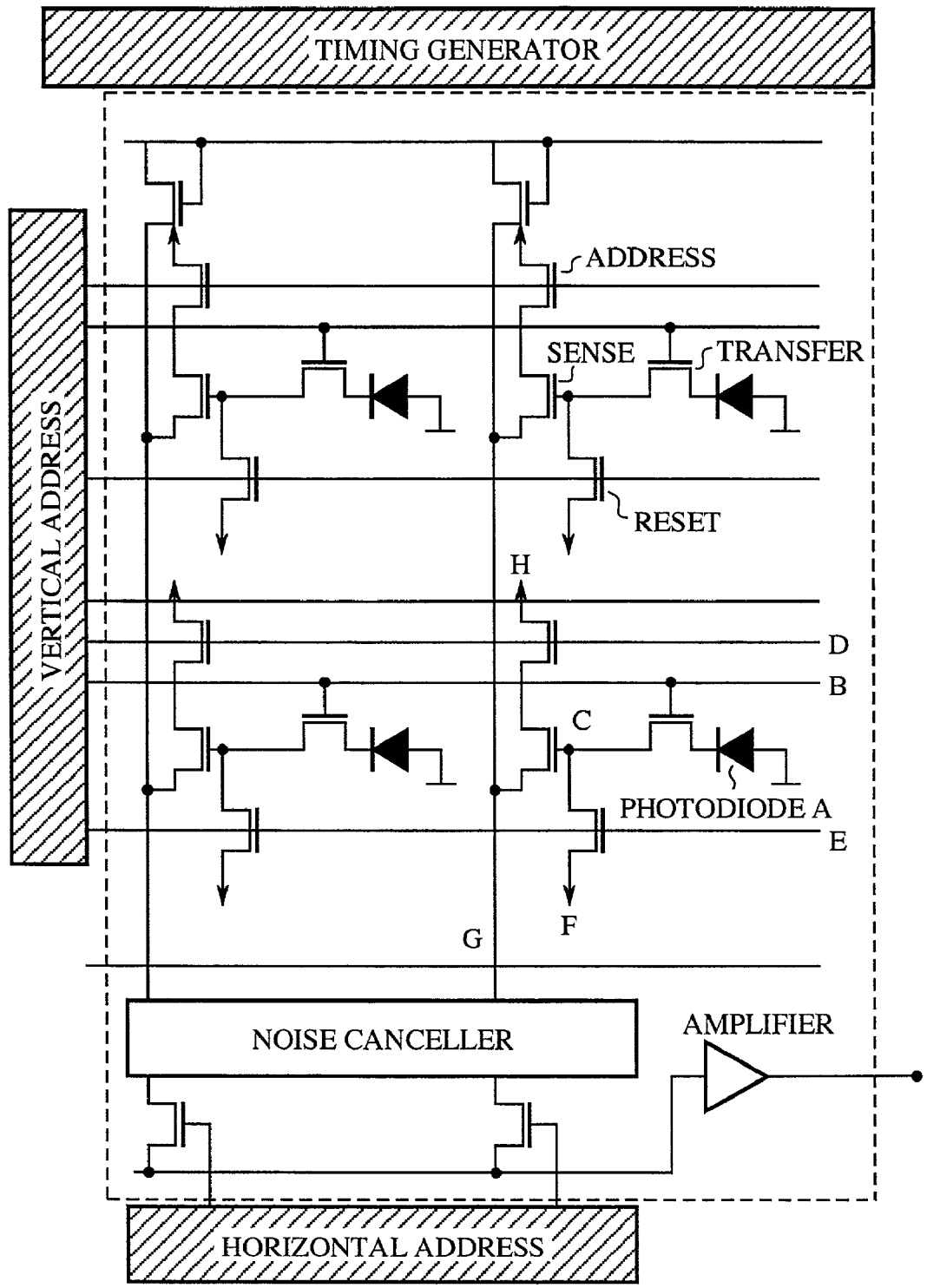
FIG. 18 is the circuit diagram of a conventional image sensor.
Figure 19:
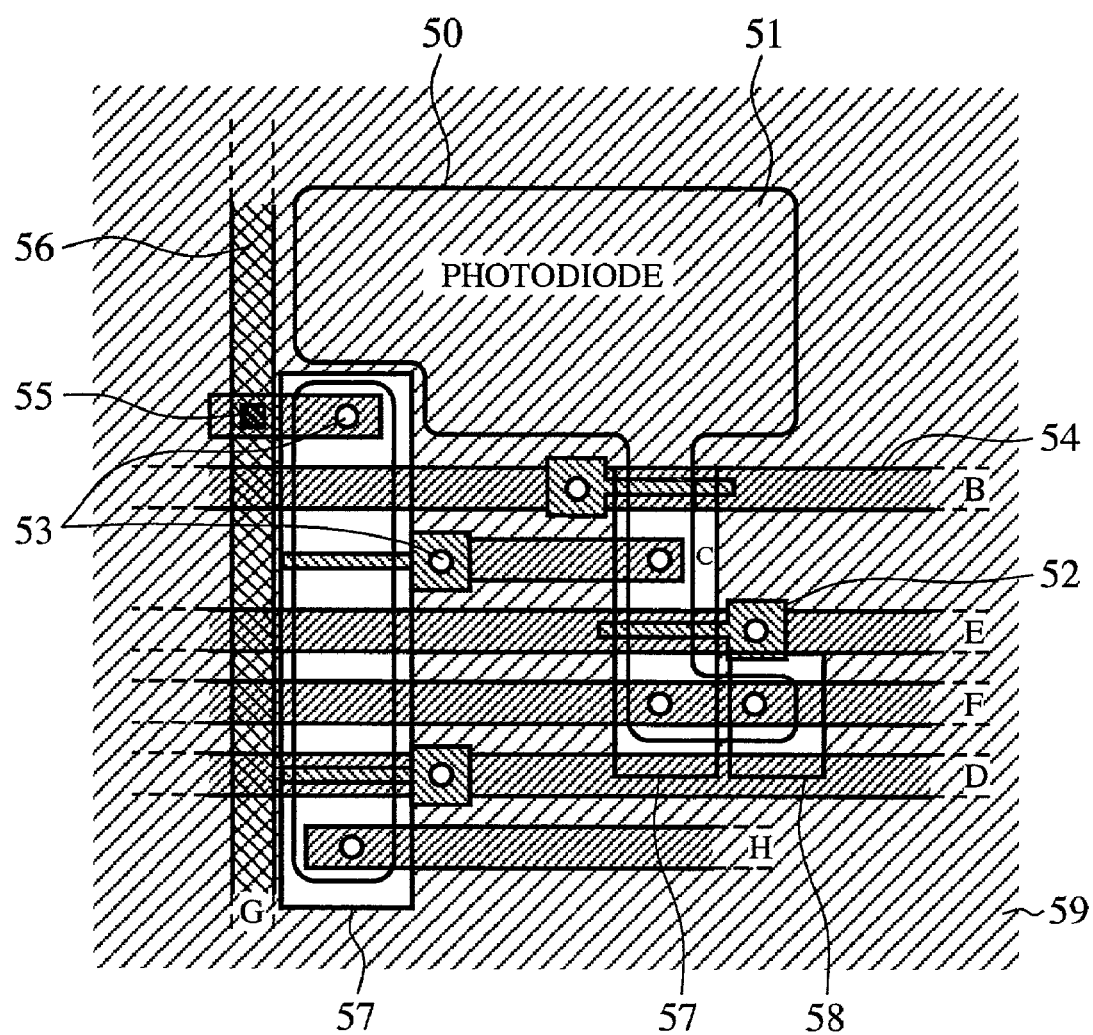
FIG. 19 is the layout pattern diagram of a conventional image sensor.

FIG. 18 is a circuit diagram of a conventional image sensor, and FIG. 19 is a layout pattern diagram of a conventional image sensor. Shown in the figures are terminals A-H, an active region 50, a photo diode 51, a gate electrode or gate wiring 52, a contact hole 53, a first metal wiring layer 54, a via hole 55, a second metal wiring layer 56, an $N^+$ source/drain implanted region 57, a $P^+$ source/drain implanted region 58, and a photoresist 59.

FIGS. 20A-20D each are an illustration showing the step at which the problem exists in the process flow in said Embodiment 1.

Figure 20:
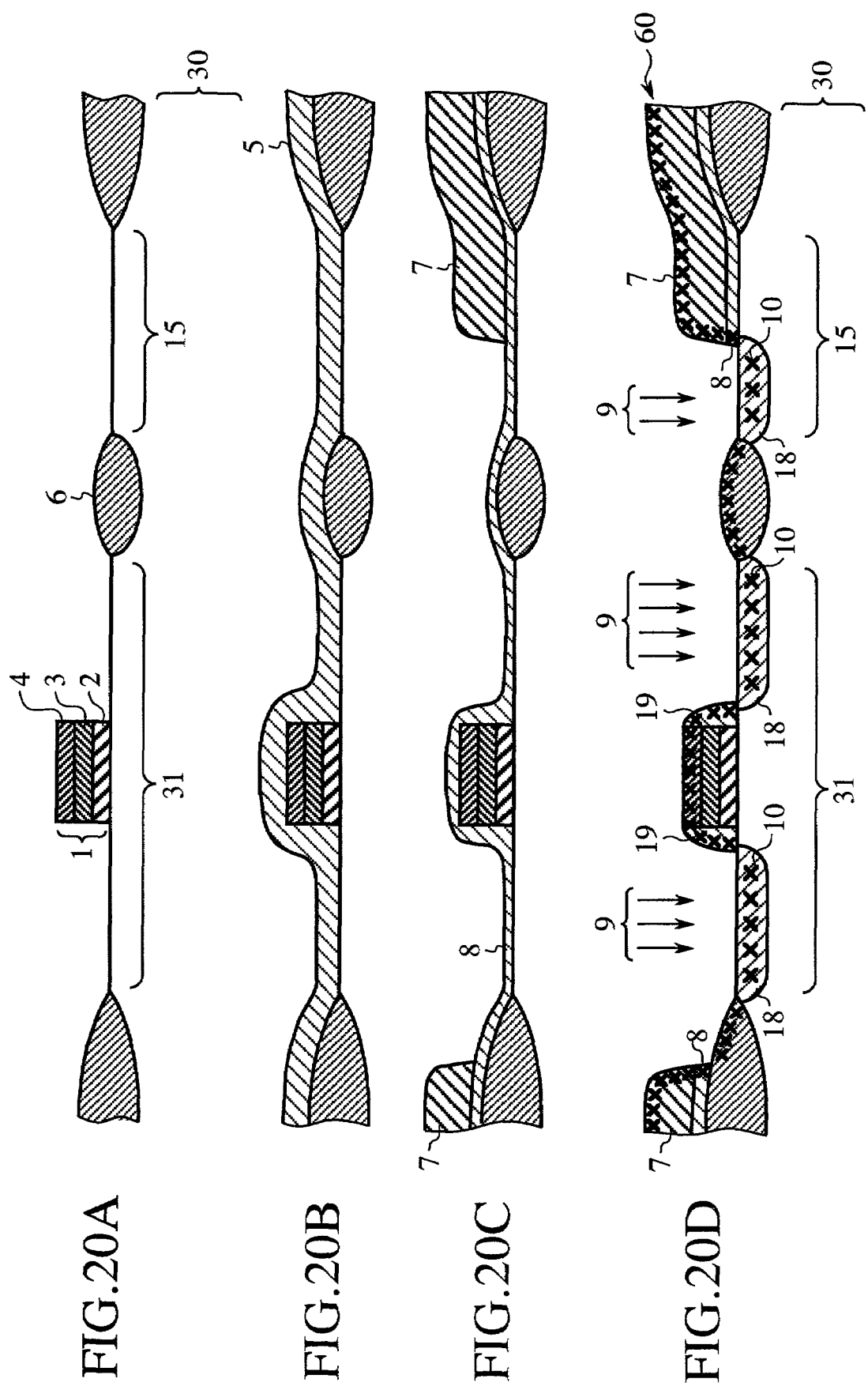
FIGS. 20A-20D each are an illustration showing a step at which a problem exists in the process flow in Embodiment 1.

Referring to FIGS. 20A-20D, a view just after the gate electrode is etched is shown in FIG. 20A. In the region where a LOCOS isolation film 6 does not exist, that is, in the active region, the gate oxide film is omitted in the figure (in reality, the oxide film partially remains although being removed upon etching the gate).

Turning next to FIG. 20B, a sidewall-forming film (TEOS oxide film) 5 is deposited, and subjected to whole region E/B, to thereby form a portion of the sidewall.

Referring next to FIG. 20C, a photoresist 7 is coated or applied, and subjected to the lithographical process, to thereby open only the region in which 2P or 2N is desired to be implanted.

Referring next to FIG. 20D, after the remaining sidewall-forming film 5 is subjected to E/B, an $N^+/P^+$ S/D implantation 9 is done through use of each mask.

At that time, only the region where the transistor is to be formed is opened in the photoresist 7, and typically, most of the regions are covered with the resist.

Therefore, as shown in FIG. 20D, charge-up is caused in an impurity-implanted layer 60 on the photoresist 7 and the oxide film. When the resist is crossing over the gate electrode, the charge-up is caused also in the gate electrode, and thereby the reliability of the gate oxide film is deteriorated.

The example will be more specifically described.

In FIG. 19, since the transistor forming the picture element is a NMOS, the $N^+$ source/drain implanted region 57 is opened to perform the implantation therein. Similarly, in order to fix the well within the picture element to the potential of the substrate 100, the $P^+$ source/drain implanted region 58 is occasionally provided.

In these cases, since the openings for only a portion of picture elements among a large number thereof are formed, the resist is remaining over a large area. Because the charge accumulated over the resist having a large area is transferred also to the gate electrode, and thereby raises the potential thereof, the reliability of the gate oxide film is deteriorated.

Figure 21:
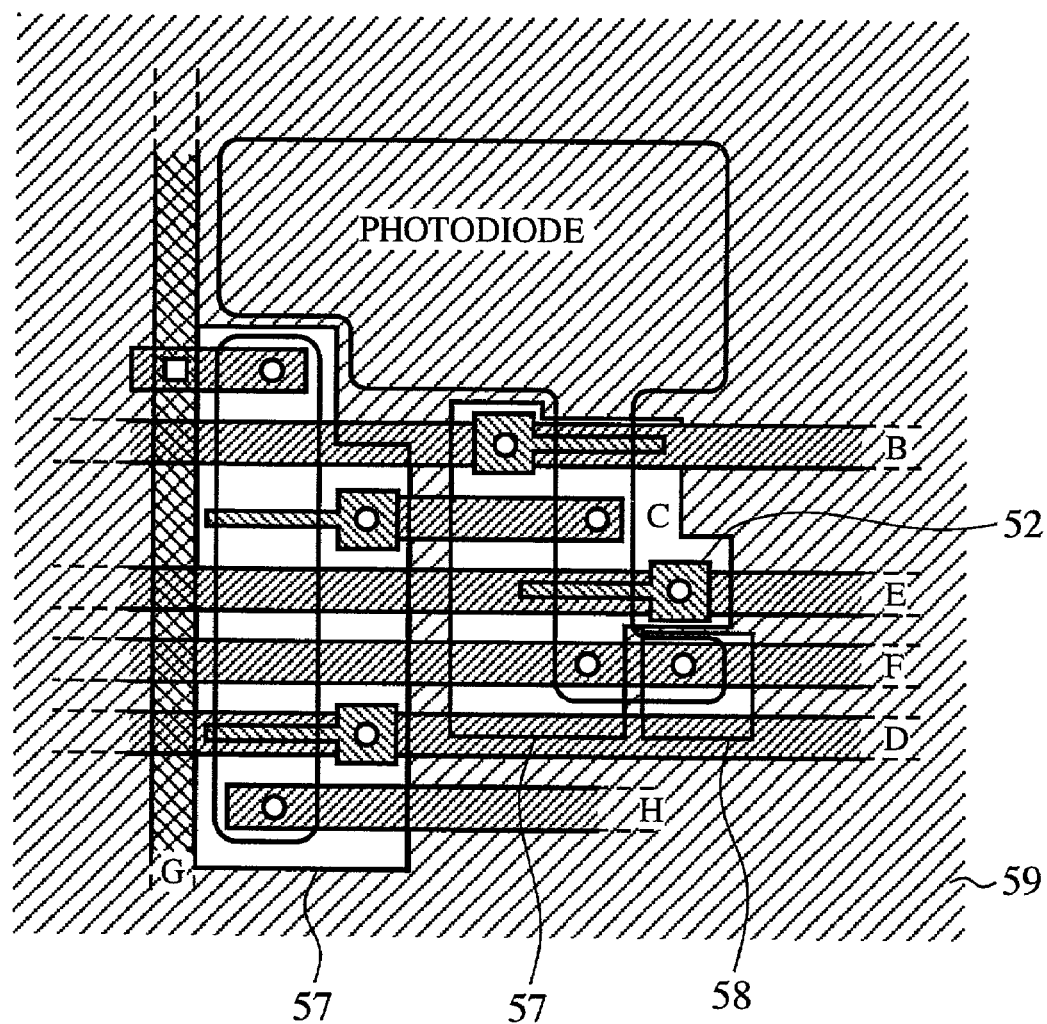
FIG. 21 is a layout pattern diagram of the image sensor according to Embodiment 8 of the present invention.

FIG. 21 is the layout pattern diagram of the image sensor according to Embodiment 8 of the present invention.

The circuit diagram of the image sensor is similar to the above-mentioned conventional example so far. However, the regions where the openings of the $N^+$ source/drain implanted region 57 and $P^+$ source/drain implanted region 58 in the layout pattern diagram are formed are different therefrom.

To be more specific, the portion of resist edge taper of the opening region of the photoresist 59 is not placed on the gate electrode 52.

By laying out them in such a manner, when the photoresist 59 has a large area, a great amount of charge that charged up therein does not run away to the gate electrode 52. As a result, the gate oxide film directly underneath the gate electrode 52 is not deteriorated.

In this process flow, the sidewall-forming film 5 is subjected to E/B only in the portion in which photoresist 59 is opened, and does not remain at all in the portion. Therefore, whether this patent is used or not can be known based on whether the sidewall-forming film 5 having not received E/B treatment is remaining or not on the gate electrode 52.

In addition, since the sidewall-forming film 5 does not remain on the electrode in the picture element, there also exists the merit that the step height is reduced and the lithographical margin in the upper layer wiring is increased.

Embodiment 9

In the aforementioned Embodiment 8, $N^+$ source/drain implanted regions 57 of each picture element are opened not connected to each other. Therefore, when the charge up is apt to occur all over the resist; the amount of the implantation is large; and the implanting current should be raised for increasing the throughput, the electrostatic breakdown of the resist might be caused in the spot where the withstand voltage resistance is most weakened because of the thickness non-uniformity of the resist, to thereby deteriorate the yield.

Figure 22A:
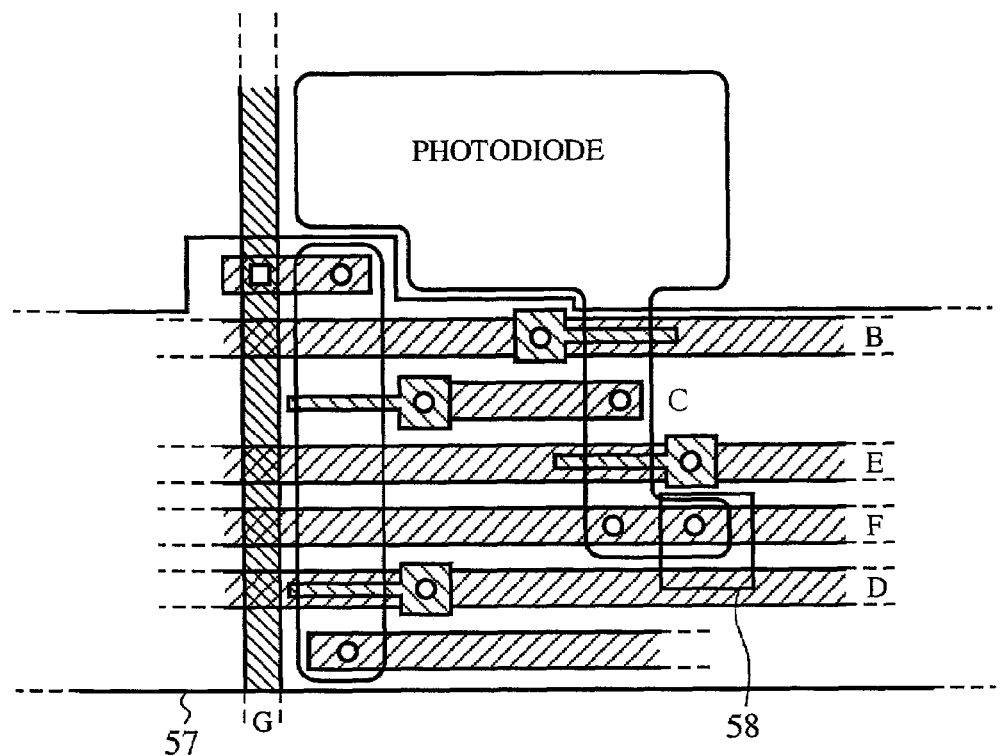
FIGS. 22A and 22B each are a layout pattern diagram of the image sensor according to Embodiment 9 of the present invention.
Figure 22B:
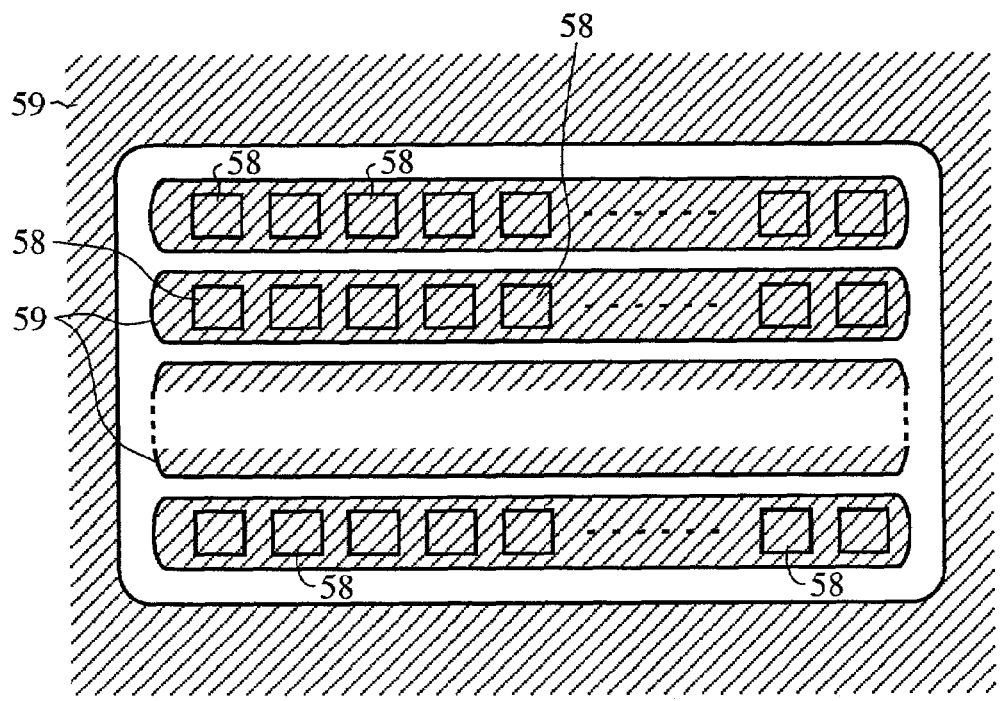
Figures 23A, 23B, 23C:
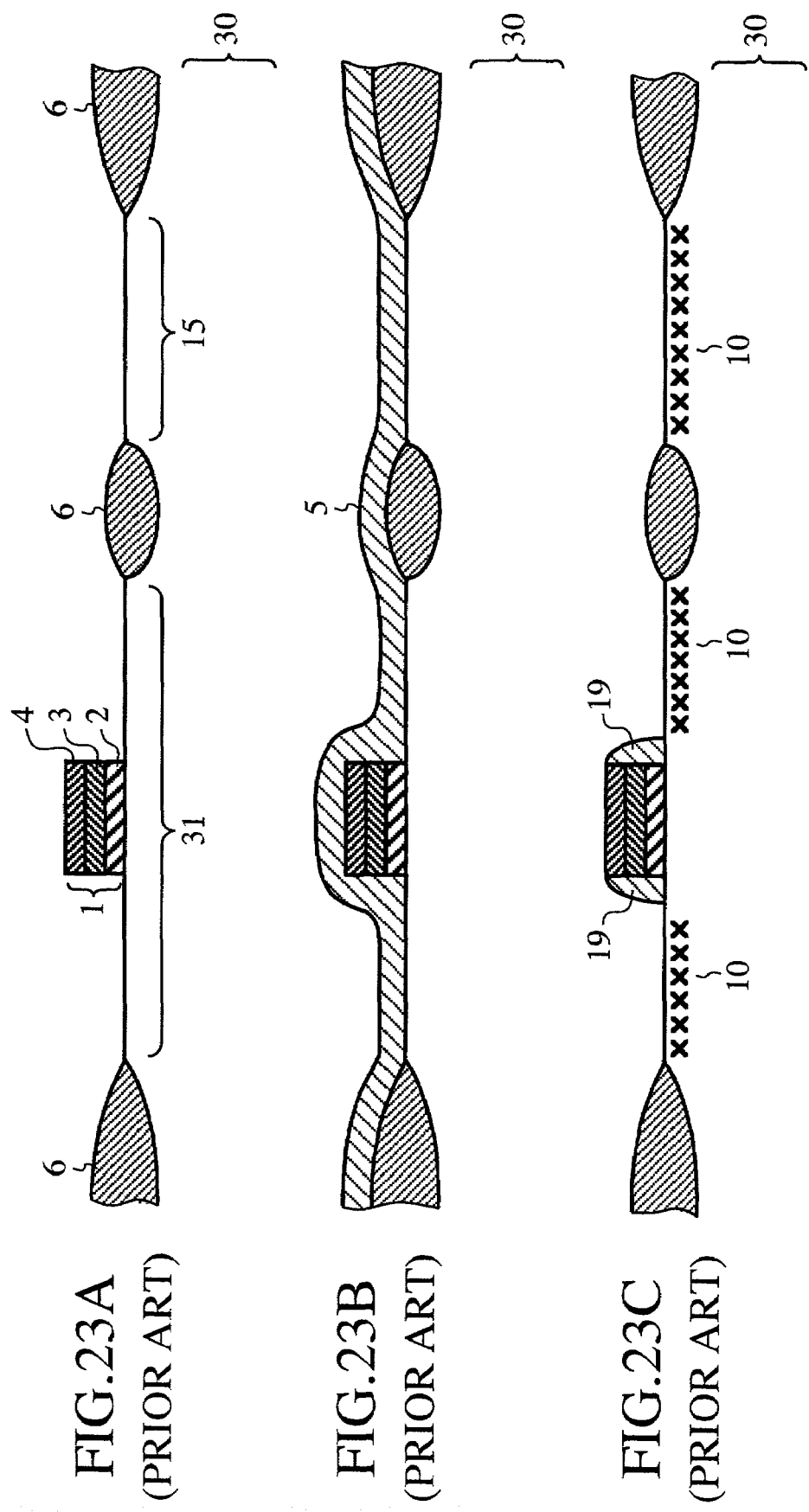
FIG. 23 is a sectional view showing each step of the method of manufacturing a conventional CMOS image sensor.

For this reason, in Embodiment 9, as shown in FIG. 22, the open regions of the photoresist are laterally connected for only the conduction type (for instance, NMOS) that is used in a large amount in each picture element.

Additionally, around the edge of the picture element plane, the pattern layout is designed such that the open regions of the resist are connected with the upper open region thereof and also with the lower one. That is, the resists covering the photodiode are made to form an island shape, to thereby reduce the charge that charges up.

Hereby, the amount of the implantation and the implantation current can be increased without causing the deterioration of yield by the electrostatic breakdown.

According to the present invention, since the sidewall of the gate electrode is formed without damaging the photo diode region, the fixed pattern noise (FPN) can be suppressed.

According to the present invention, since the major portion except a portion expected as a contact hole within the photodiode is covered with the photoresist, the etching-damaged layer can be reduced.

According to the present invention, since the remaining film obtained by halfway-stopping processing the sidewall-forming film by E/B is removed by wet etching, the surface of the semiconductor substrate is not at all exposed to the plasma by etching. In addition, since wet etching is performed all over the surface, the number of process steps can be reduced.

According to the present invention, since the surface of the photodiode is covered with the surface-protecting film, there exists no plasma damage to the surface.

According to the present invention, since the edge of LOCOS within the photo diode is not etched by the E/B for forming the sidewall, the junction leakage from the edge of LOCOS can be reduced.

According to the present invention, since the surface of the photodiode is covered with the protecting oxide film, there exists no plasma damage to the surface. Additionally, since the edge of LOCOS within the photodiode is not etched by the E/B for forming the sidewall, there exists no damage caused by the etchback and also no damage caused by the ion implantation to the LOCOS edge, the junction leakage can be further reduced. Moreover, since only the contact within the photodiode region is independently formed, an optimal condition having a balance between the contact resistance and the junction leakage compared with the other contact holes in which the S/D implantation is previously fixed by the characteristics of the transistor can be provided.

According to the present invention, since the contact hole requiring no barrier metal with doped polysilicon or doped α silicon being buried therein, is formed within the photodiode region, the junction leakage hardly occurs even if the misalignment in the lithography occurs.

According to the present invention, since only the $Si_3N_4$ film is processed by E/B, the stability of the process is higher compared with a case in which etching is halfway stopped. Moreover, since the sidewall is formed by use of a $Si_3N_4$ film, any variations in the performance of the transistor does not occur since the $Si_3N_4$ film is not etched even if the opening of the contact hole borders on the sidewall.

According to the present invention, since a $P^+$ S/D implantation is done in the state where the photoresist remains, the mask for the $P^+$ S/D implantation is not newly required.

According to the present invention, since the $P^+$ S/D implantation is done after the blanket etching is done, the area in which the $P^+$ S/D implanted layer is to be formed can be provided independently from the area in which the etching is done.

According to the present invention, since a high-dose implantation is carried out through the oxide film, the implantation of contaminations such as carbon adhering to the surface caused by knocking on can be reduced. Moreover, because $P^+$ S/D implantation is performed in the state where surface-protecting film remains, the wet-etching process can be eliminated.

According to the present invention, since the blanket E/B is be done to the sidewall-forming film before the step of patterning the photoresist, the step height on the surface of the CMOS image sensor can reduced.

According to the present invention, since the gate electrode or the gate wiring is pattern-laid out such that the electrode or the wiring does not cross over the portion of the resist edge taper of a resist mask when performing $N^+/P^+$ source drain implantation, the deterioration of the reliability of the gate oxide film can be prevented.

According to the present invention, since the resist covering the portion of the photodiode is pattern-laid out such that the resist exists independently shaped like an island in each line of the picture elements, the deterioration of yield by the electrostatic breakdown is not caused, and the amount of implantation and the implanting current can be increased.

What is claimed is:

1. A method of manufacturing a CMOS image sensor, comprising the steps of:

forming a LOCOS isolation film over a surface of a semiconductor substrate containing a peripheral circuit and a photodiode region;

forming a gate electrode on a surface of the peripheral circuit;

depositing a sidewall-forming film, all over the surface of the semiconductor substrate; and forming a sidewall of the gate electrode, wherein the step of forming the sidewall of the gate electrode comprises the steps of:

performing blanket E/B over the sidewall-forming film in a halfway-stopping etching therein forming the surface-protecting film;

applying a photoresist over the surface-protecting film while lithographically processing the photoresist therein patterning the photoresist such that the photoresist exposes the peripheral circuit and covers at least a portion of the photodiode region; and E/B-processing the surface-protecting film therein forming the sidewall of the gate electrode.

2. The method of manufacturing a CMOS image sensor according to claim 1, wherein the photoresist is patterned such that the photoresist covers the LOCOS isolation film surrounding the photodiode region of the LOCOS isolation film.

3. The method of manufacturing a CMOS image sensor according to claim 1, wherein the photoresist covers all over the photodiode region.

4. The method of manufacturing a CMOS image sensor according to claim 1, characterized by further comprising the step of performing $P^+$ S/D implantation in the state in which the photoresist is remaining thereby forming a $P^+$ S/D implanted layer.

* * * * *